(12) United States Patent
Wu et al.

(10) Patent No.: US 12,363,947 B2
(45) Date of Patent: Jul. 15, 2025

(54) STRUCTURE AND FORMATION METHOD OF SEMICONDUCTOR DEVICE WITH CONTACT STRUCTURES

(71) Applicant: Taiwan Semiconductor Manufacturing Company, Ltd., Hsinchu (TW)

(72) Inventors: Shih-Chieh Wu, Hsinchu (TW); Pang-Chi Wu, Hsinchu (TW); Wang-Jung Hsueh, New Taipei (TW); Chao-Hsun Wang, Taoyuan (TW); Kuo-Yi Chao, Hsinchu (TW); Mei-Yun Wang, Hsin-Chu (TW); Yi-Chun Chang, Hsinchu (TW); Yuan-Tien Tu, Puzih (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 399 days.

(21) Appl. No.: 17/444,132

(22) Filed: Jul. 30, 2021

(65) Prior Publication Data

US 2023/0033570 A1    Feb. 2, 2023

(51) Int. Cl.
*H01L 29/423*    (2006.01)
*H01L 21/8234*   (2006.01)
(Continued)

(52) U.S. Cl.
CPC ....... *H10D 30/6735* (2025.01); *H10D 30/024* (2025.01); *H10D 30/6211* (2025.01);
(Continued)

(58) Field of Classification Search
CPC ............. H01L 21/28141; H01L 21/768; H01L 21/76816; H01L 21/76895; H01L 21/76897; H01L 21/76898; H01L 21/823425; H01L 21/823431; H01L 21/823821; H01L 21/823871;
(Continued)

(56) References Cited

U.S. PATENT DOCUMENTS 8,772,109 B2    7/2014  Colinge
8,785,285 B2    7/2014  Tsai et al.
(Continued)

*Primary Examiner* — David C Spalla
(74) *Attorney, Agent, or Firm* — Birch, Stewart, Kolasch & Birch, LLP

(57) ABSTRACT

A semiconductor device structure and a method for forming a semiconductor device structure are provided. The semiconductor device structure includes a metal gate stack over a substrate and an epitaxial structure over the substrate. The semiconductor device structure also includes a conductive contact electrically connected to the epitaxial structure. A topmost surface of the metal gate stack is vertically disposed between a topmost surface of the conductive contact and a bottommost surface of the conductive contact. The semiconductor device structure further includes a first conductive via electrically connected to the metal gate stack. The topmost surface of the conductive contact is vertically disposed between a topmost surface of the first conductive via and a bottommost surface of the first conductive via. In addition, the semiconductor device structure includes a second conductive via electrically connected to the conductive contact.

20 Claims, 21 Drawing Sheets

(51) Int. Cl.
    *H01L 29/08*     (2006.01)
    *H01L 29/66*     (2006.01)
    *H01L 29/78*     (2006.01)
    *H10D 30/01*     (2025.01)
    *H10D 30/62*     (2025.01)
    *H10D 30/67*     (2025.01)
    *H10D 62/13*     (2025.01)
    *H10D 64/01*     (2025.01)
    *H10D 84/01*     (2025.01)
    *H10D 84/03*     (2025.01)

(52) U.S. Cl.
    CPC ......... *H10D 62/151* (2025.01); *H10D 64/017* (2025.01); *H10D 64/021* (2025.01); *H10D 84/0133* (2025.01); *H10D 84/038* (2025.01)

(58) Field of Classification Search
CPC ..... H01L 21/845; H01L 23/48; H01L 23/481; H01L 27/0207; H01L 27/0886; H01L 27/0924; H01L 27/1211; H01L 29/0653; H01L 29/0847; H01L 29/41791; H01L 29/42392; H01L 29/66545; H01L 29/6653; H01L 29/66553; H01L 29/6656; H01L 29/66795; H01L 29/785; H01L 29/7851; H01L 29/7853; H01L 29/7855; H01L 2029/7858; H10D 30/014; H10D 30/024; H10D 30/62; H10D 30/6211; H10D 30/6212; H10D 30/6219; H10D 30/6713; H10D 30/6735; H10D 30/797; H10D 62/021; H10D 62/118; H10D 62/119; H10D 62/121; H10D 62/149; H10D 62/151; H10D 64/017; H10D 64/018; H10D 64/021; H10D 84/013; H10D 84/0133; H10D 84/0158; H10D 84/017; H10D 84/0193; H10D 84/038; H10D 84/834; H10D 84/853

See application file for complete search history.

(56) References Cited

U.S. PATENT DOCUMENTS

| | | | |
|---|---|---|---|
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 2018/0174904 | A1* | 6/2018 | Hsieh ................ H01L 21/76831 |
| 2019/0296124 | A1* | 9/2019 | Hsu ................... H01L 29/41791 |
| 2020/0035796 | A1* | 1/2020 | Lee ................ H01L 21/823475 |
| 2021/0066500 | A1* | 3/2021 | Liu ................. H01L 21/823807 |

\* cited by examiner

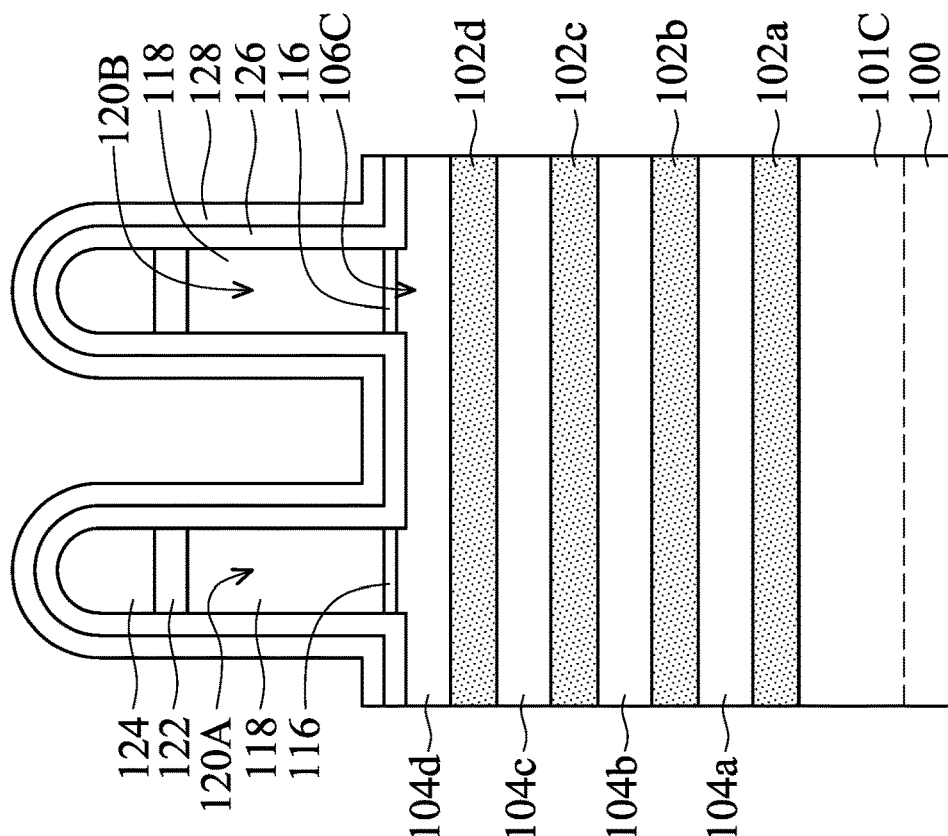
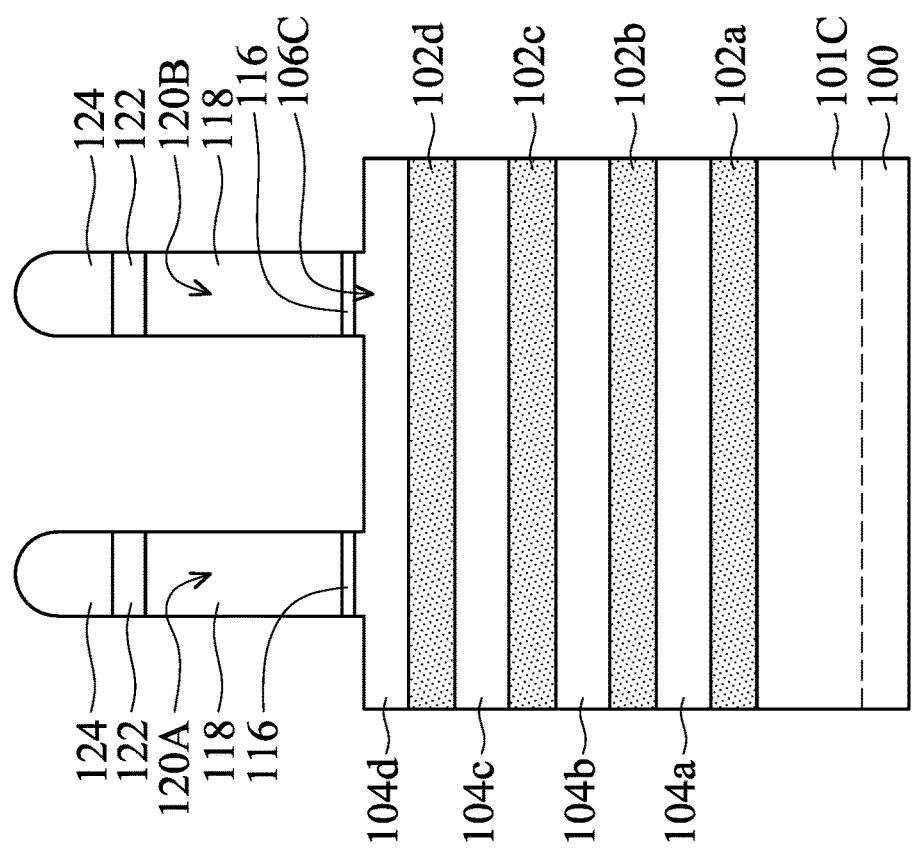
FIG. 3A
FIG. 3B

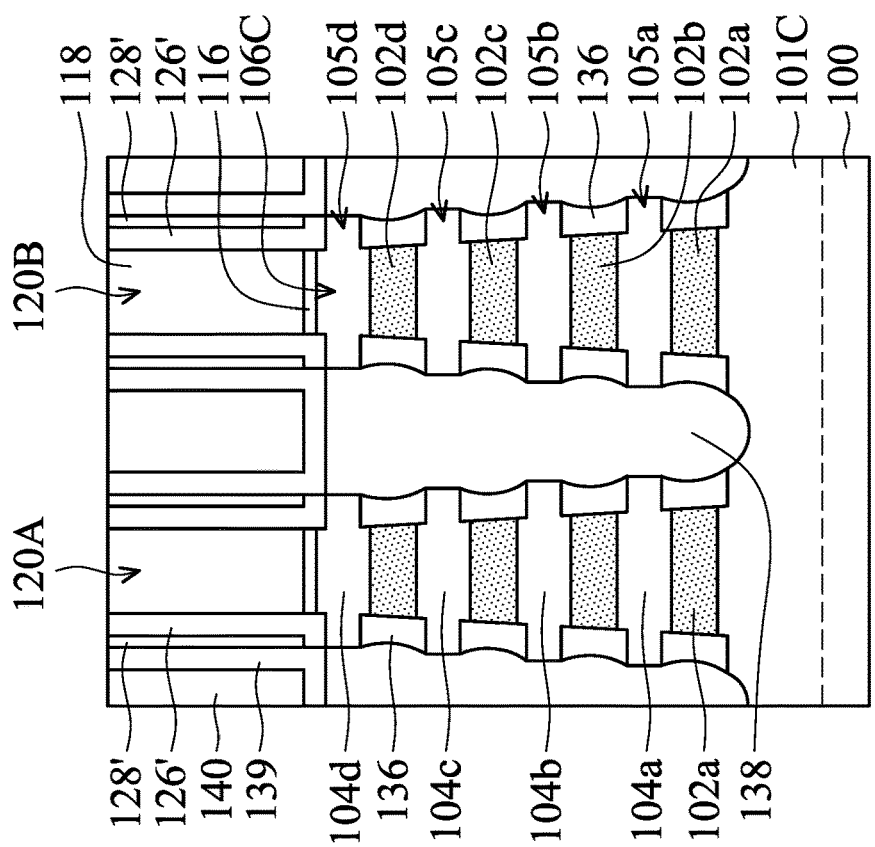
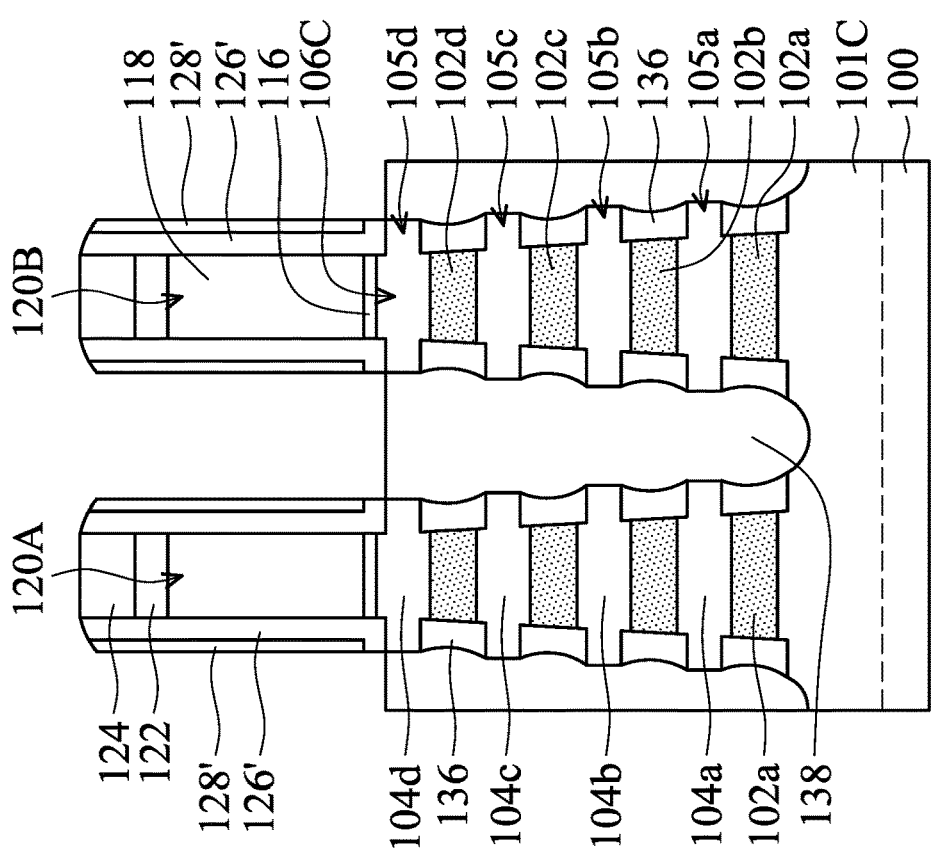
FIG. 3H
FIG. 3G

STRUCTURE AND FORMATION METHOD OF SEMICONDUCTOR DEVICE WITH CONTACT STRUCTURES

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
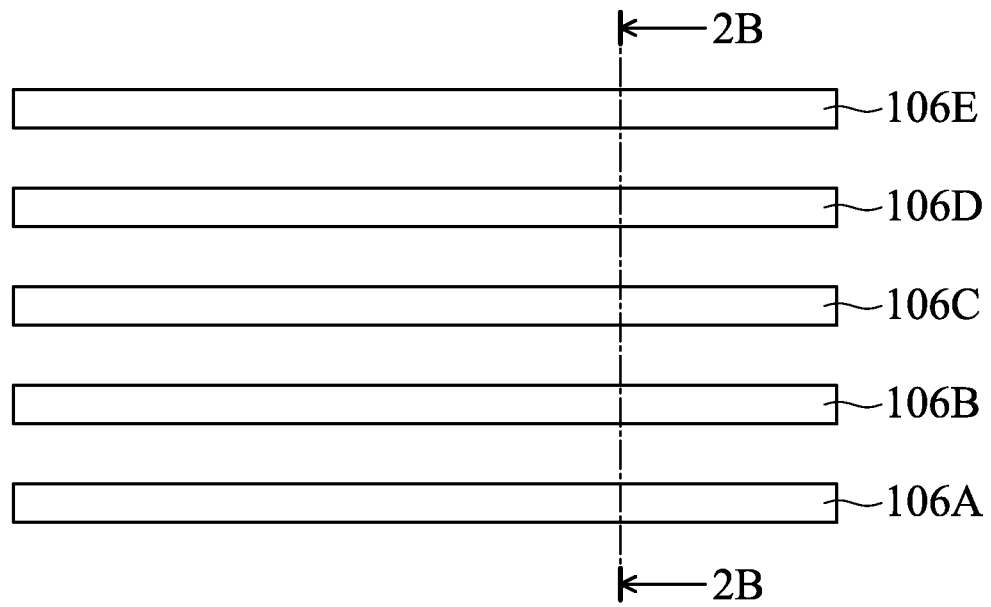
FIGS. 1A-1B are top views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 100 in some embodiments. The word "substantially" does not exclude "completely" e.g. a composition which is "substantially free" from Y may be completely free from Y in some embodiments.

Terms such as "about" in conjunction with a specific distance or size are to be interpreted so as not to exclude insignificant deviation from the specified distance or size and may include for example deviations of up to 10% in some embodiments. The term "about" in relation to a numerical value x may mean x±5 or 10% in some embodiments.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
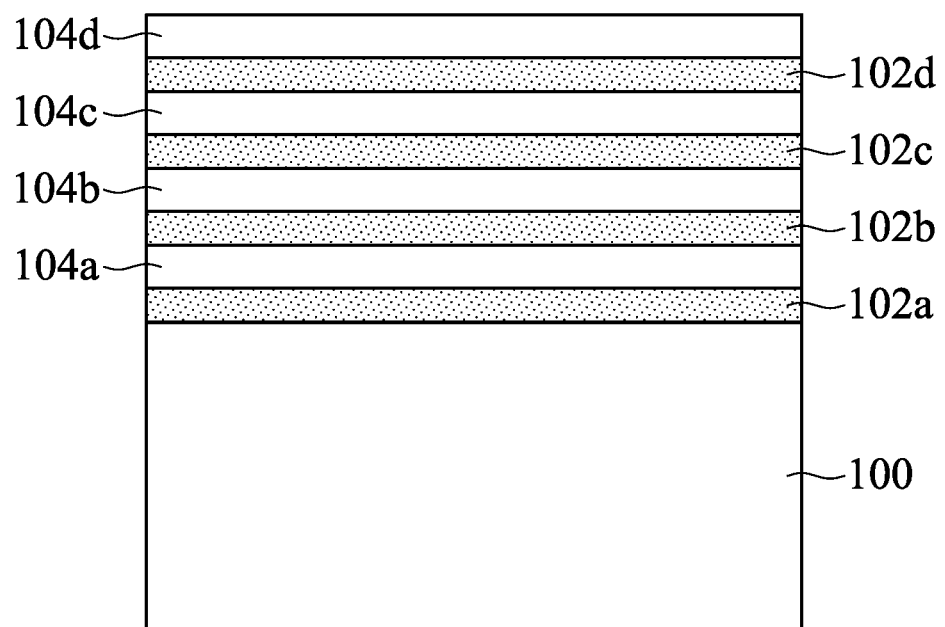
FIGS. 2A-2D are cross-sectional views of various stages of a process for forming a portion of a semiconductor device structure, in accordance with some embodiments.

FIGS. 2A-2D are cross-sectional views of various stages of a process for forming a portion of a semiconductor device structure, in accordance with some embodiments. As shown in FIG. 2A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 2A, a semiconductor stack having multiple semiconductor layers is formed over the semiconductor substrate 100, in accordance with some embodiments. In some embodiments, the semiconductor stack includes multiple semiconductor layers 102a, 102b, 102c, and 102d. The semiconductor stack also includes multiple semiconductor layers 104a, 104b, 104c, and 104d. In some embodiments, the semiconductor layers 102a-102d and the semiconductor layers 104a-104d are laid out alternately, as shown in FIG. 2A.

In some embodiments, the semiconductor layers 102a-102d function as sacrificial layers that will be removed in a subsequent process to release the semiconductor layers 104a-104d. The semiconductor layers 104a-104d that are released may function as channel structures of one or more transistors.

In some embodiments, the semiconductor layers 104a-104d that will be used to form channel structures are made of a material that is different than that of the semiconductor layers 102a-102d. In some embodiments, the semiconductor layers 104a-104d are made of or include silicon, germanium, other suitable materials, or a combination thereof. In some embodiments, the semiconductor layers 102a-102d are made of or include silicon germanium. In some other embodiments, the semiconductor layers 104a-104d are made of silicon germanium, and the semiconductor layers 102a-102d are made of silicon germanium with different atomic concentration of germanium than that of the semiconductor layers 104a-104s. As a result, different etching selectivity and/or different oxidation rates during subsequent processing may be achieved between the semiconductor layers 102a-102d and the semiconductor layers 104a-104d.

The present disclosure contemplates that the semiconductor layers 102a-102d and the semiconductor layers 104a-104d include any combination of semiconductor materials that can provide desired etching selectivity, desired oxidation rate differences, and/or desired performance characteristics (e.g., materials that maximize current flow).

In some embodiments, the semiconductor layers 102a-102d and 104a-104d are formed using multiple epitaxial growth operations. Each of the semiconductor layers 102a-102d and 104a-104d may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof.

In some embodiments, the semiconductor layers 102a-102d and 104a-104d are grown in-situ in the same process chamber. In some embodiments, the growth of the semiconductor layers 102a-102d and 104a-104d are alternately and sequentially performed in the same process chamber to complete the formation of the semiconductor stack. In some embodiments, the vacuum of the process chamber is not broken before the epitaxial growth of the semiconductor stack is accomplished.

Afterwards, hard mask elements are formed over the semiconductor stack to assist in a subsequent patterning of the semiconductor stack. One or more photolithography processes and one or more etching processes are used to pattern the semiconductor stack into fin structures 106A, 106B, 106C, 106D, and 106E, as shown in FIG. 2B in accordance with some embodiments.

The fin structures 106A-106E may be patterned by any suitable method. For example, the fin structures 106A-106E may be patterned using one or more photolithography processes, including double-patterning or multi-patterning processes. Double-patterning or multi-patterning processes may combine photolithography and self-aligned processes, allowing patterns to be created that have, for example, pitches smaller than what is otherwise obtainable using a single, direct photolithography process.

Figure 2B:
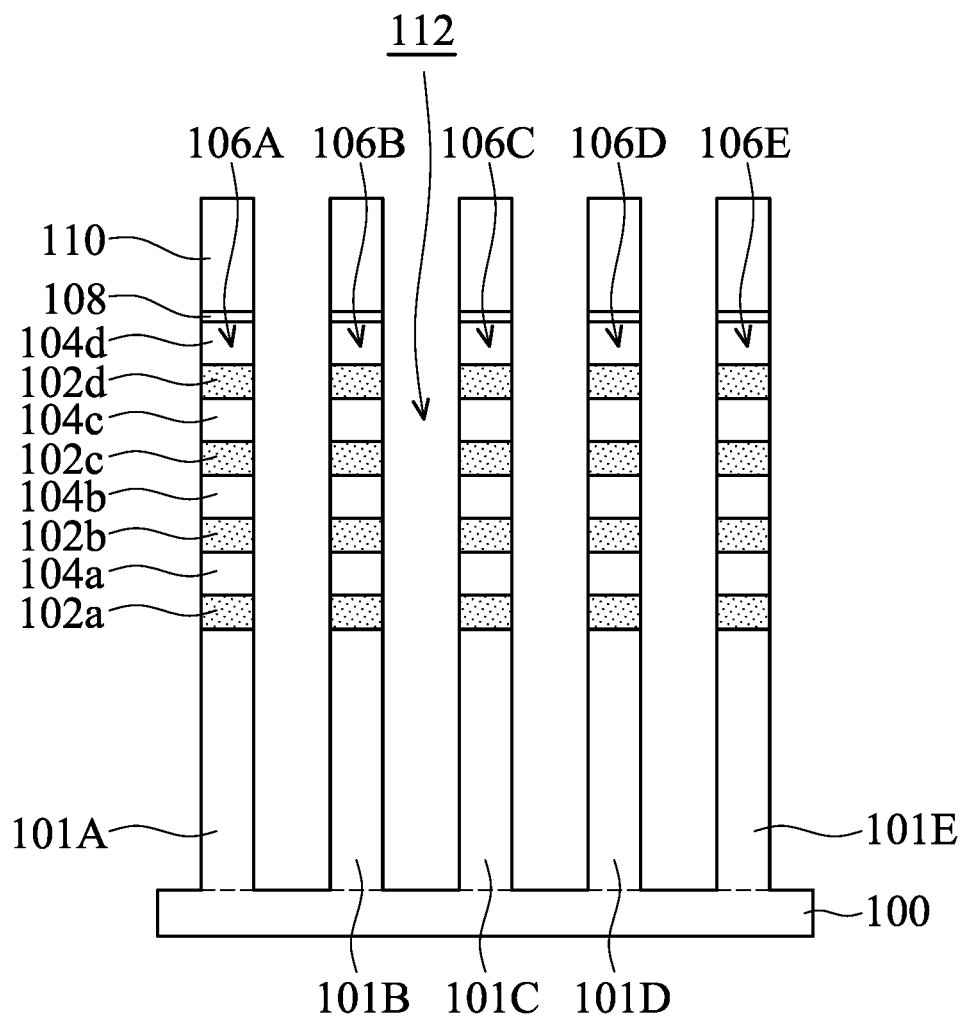

The semiconductor stack is partially removed to form trenches 112, as shown in FIG. 2B. Each of the fin structures 106A-106E may include portions of the semiconductor layers 102a-102d and 104a-104d and semiconductor fins 101A, 101B, 101C, 101D, and 101E. The semiconductor substrate 100 may also be partially removed during the etching process that forms the fin structures 106A-106E. Protruding portions of the semiconductor substrate 100 that remain form the semiconductor fins 101A-101E.

Each of the hard mask elements may include a first mask layer 108 and a second mask layer 110. The first mask layer 108 and the second mask layer 110 may be made of different materials. In some embodiments, the first mask layer 108 is made of a material that has good adhesion to the semiconductor layer 104d. The first mask layer 108 may be made of silicon oxide, germanium oxide, silicon germanium oxide, one or more other suitable materials, or a combination thereof. The second layer 110 may be made of silicon nitride, silicon oxynitride, silicon carbide, one or more other suitable materials, or a combination thereof.

Figure 1B:
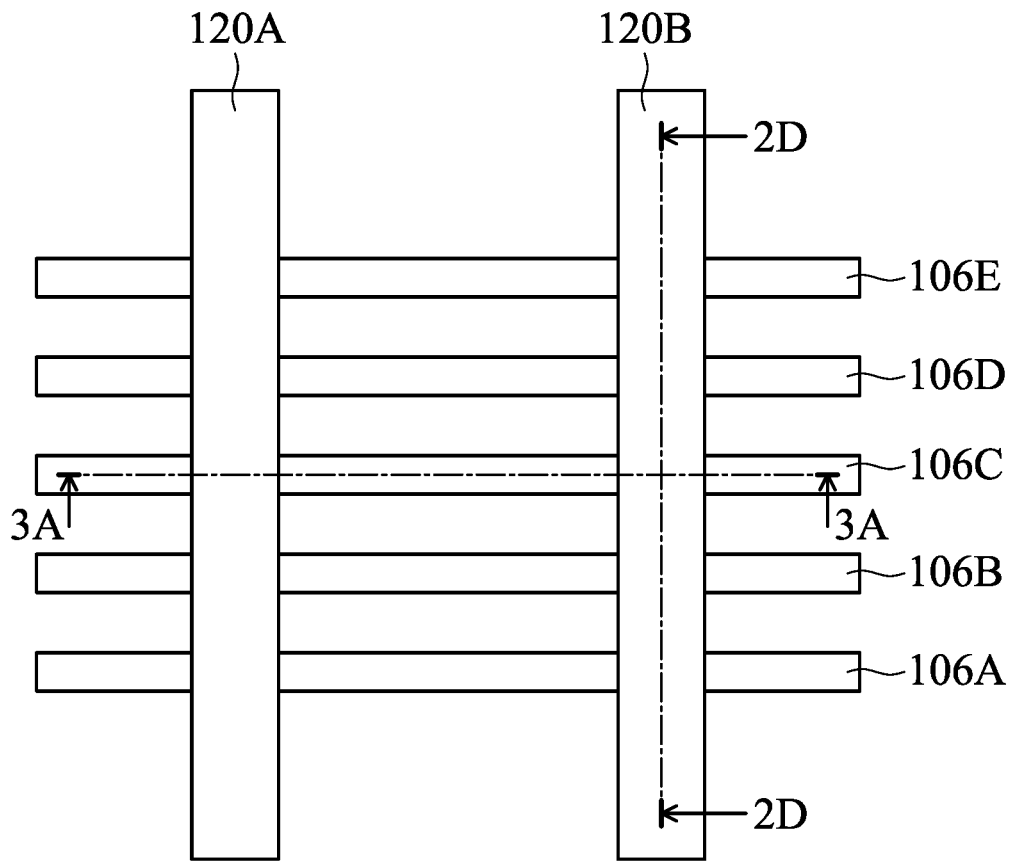

FIGS. 1A-1B are top views of various stages of a process for forming a portion of a semiconductor device structure, in accordance with some embodiments. In some embodiments, the fin structures 106A-106E are oriented lengthwise. In some embodiments, the longitudinal extending directions of the fin structures 106A-106E are substantially parallel to each other, as shown in FIG. 1A. In some embodiments, FIG. 2B is a cross-sectional view of the structure taken along the line 2B-2B in FIG. 1A.

Figure 2C:
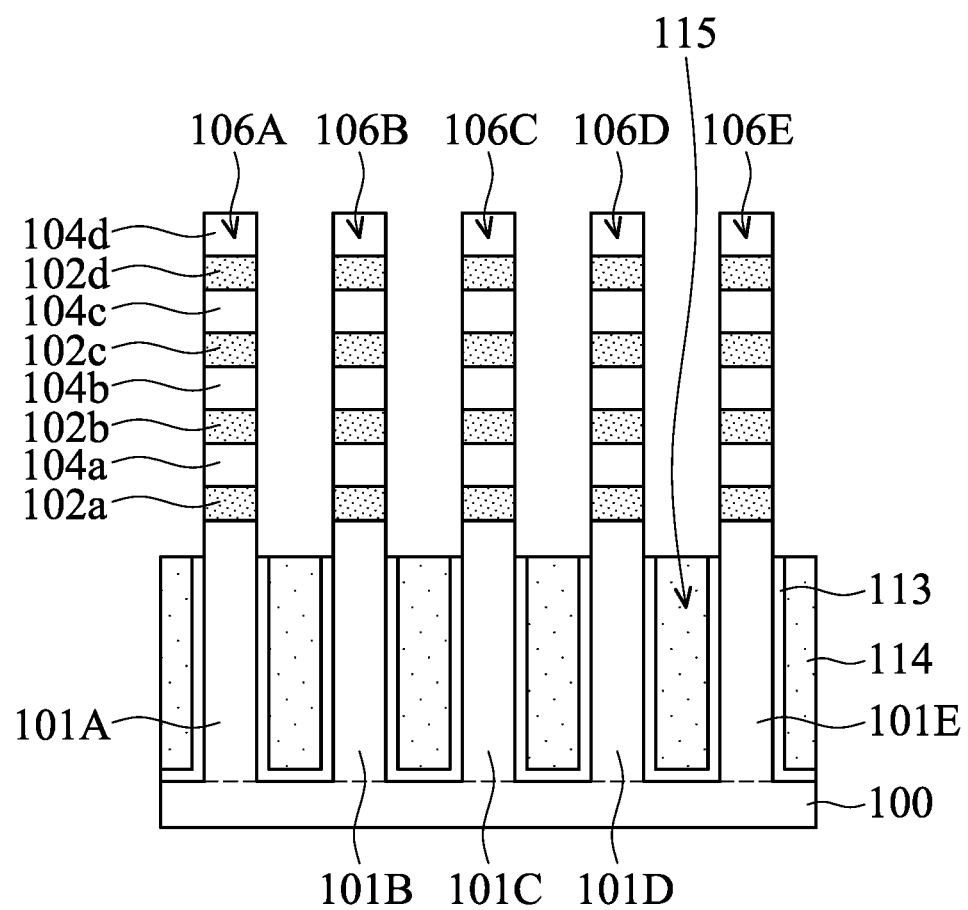

As shown in FIG. 2C, an isolation structure 115 is formed to surround lower portions of the fin structures 106A-106E, in accordance with some embodiments. In some embodiments, the isolation structure 115 includes a dielectric filling 114 and a liner layer 113 that is adjacent to the semiconductor fins 101A-101E. In some embodiments, the semiconductor fins 101A-101E protrude from the top surface of the isolation structure 115.

In some embodiments, one or more dielectric layers are deposited over the fin structures 106A-106E and the semiconductor substrate 100 to overfill the trenches 112. The dielectric layers may be made of silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. The liner layer 113 may be made of or include silicon nitride, silicon oxynitride, silicon carbide, silicon oxycarbide, one or more other suitable materials, or a combination thereof. The dielectric layers and the liner layer 113 may be deposited using a flowable chemical vapor deposition (FCVD) process, an atomic layer deposition (ALD) process, a chemical vapor deposition (CVD) process, one or more other applicable processes, or a combination thereof.

Afterwards, a planarization process is used to partially remove the dielectric layers and the liner layer 113. The hard mask elements (including the first mask layer 108 and the second mask layer 110) may also function as stop layers of the planarization process. The planarization process may include a chemical mechanical polishing (CMP) process, a grinding process, a dry polishing process, an etching process, one or more other applicable processes, or a combination thereof.

Afterwards, one or more etching back processes are used to partially remove the dielectric layers and the liner layer 113. As a result, the remaining portion of the dielectric layers forms the dielectric filling 114 of the isolation structure 115. Upper portions of the fin structures 106A-106E protrude from the top surface of the isolation structure 115, as shown in FIG. 2C.

In some embodiments, the etching back process for forming the isolation structure 115 is carefully controlled to ensure that the topmost surface of the isolation structure 115 is positioned at a suitable height level, as shown in FIG. 2C. In some embodiments, the topmost surface of the isolation structure 115 is below the bottommost surface of the semiconductor layer 102a which functions as a sacrificial layer.

Afterwards, the remaining portions of the hard mask elements (including the first mask layer 108 and the second mask layer 110) are removed. Alternatively, in some other embodiments, the hard mask elements are removed or consumed during the planarization process and/or the etching back process that forms the isolation structure 115.

Figure 2D:
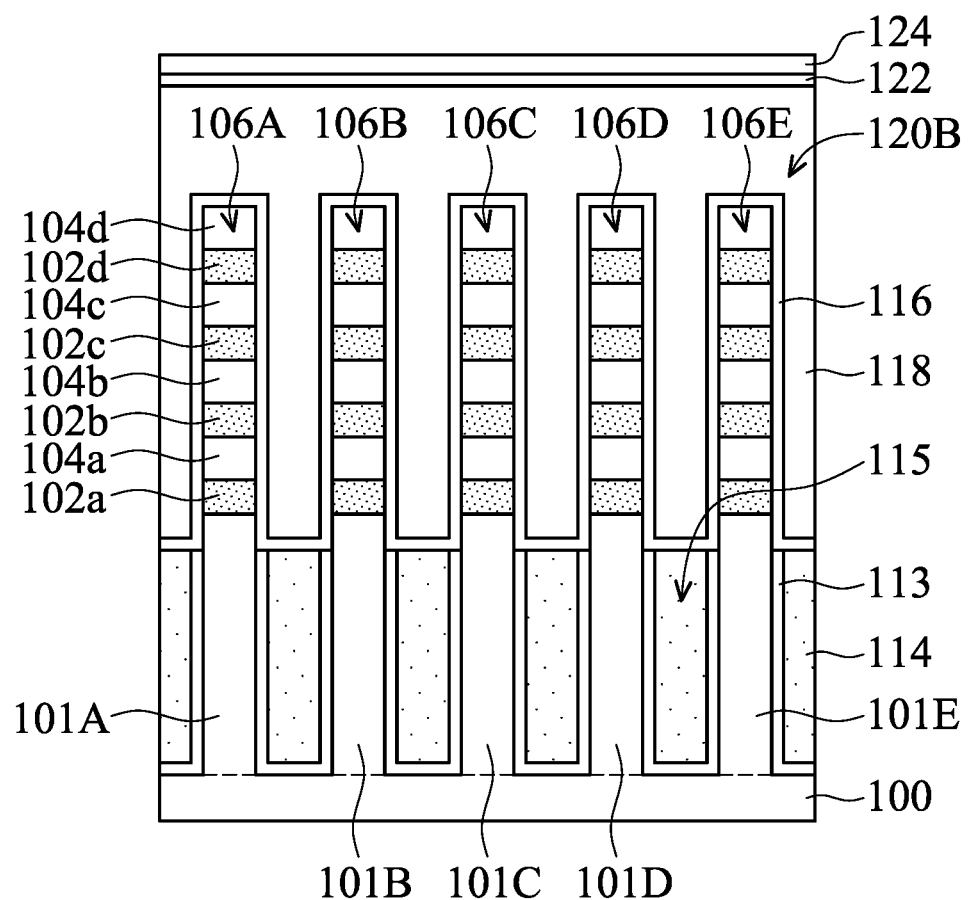

Afterwards, dummy gate stacks 120A and 120B are formed to extend across the fin structures 106A-106E, as shown in FIG. 1B in accordance with some embodiments. In some embodiments, FIG. 2D is a cross-sectional view of the structure taken along the line 2D-2D in FIG. 1B. FIGS. 3A-3R are cross-sectional views of various stages of a process for forming a portion of a semiconductor device structure, in accordance with some embodiments. In some embodiments, FIG. 3A is a cross-sectional view of the structure taken along the line 3A-3A in FIG. 1B.

As shown in FIGS. 1B, 2D, and 3A, the dummy gate stacks 120A and 120B are formed to partially cover and to extend across the fin structures 106A-106E, in accordance with some embodiments. In some embodiments, the dummy gate stacks 120A and 120B are wrapped around portions of the fin structures 106A-106E. As shown in FIG. 2D, the dummy gate stack 120B extends across and is wrapped around the fin structures 106A-106E. As shown in FIG. 1B, other portions of the fin structures 106A-106E are exposed without being covered by the dummy gate stack 120A or 120B.

As shown in FIGS. 2D and 3A, each of the dummy gate stacks 120A and 120B includes a dummy gate dielectric layer 116 and a dummy gate electrode 118. The dummy gate dielectric layer 116 may be made of or include silicon oxide or another suitable material. The dummy gate electrodes 118 may be made of or include polysilicon or another suitable material.

In some embodiments, a dummy gate dielectric material layer and a dummy gate electrode layer are sequentially deposited over the isolation structure 115 and the fin structures 106A-106E. The dummy gate dielectric material layer may be deposited using an ALD process, a CVD process, one or more other applicable processes, or a combination thereof. The dummy gate electrode layer may be deposited using a CVD process. Afterwards, the dummy gate dielectric material layer and the dummy gate electrode layer are patterned to form the dummy gate stacks 120A and 120B.

In some embodiments, hard mask elements including mask layers 122 and 124 are used to assist in the patterning process for forming the dummy gate stacks 120A and 120B. With the hard mask elements as an etching mask, one or more etching processes are used to partially remove the dummy gate dielectric material layer and the dummy gate electrode layer. As a result, remaining portions of the dummy gate dielectric material layer and the dummy gate electrode layer form the dummy gate stacks 120A and 120B that include the dummy gate dielectric layer 116 and the dummy gate electrodes 118.

As shown in FIG. 3B, spacer layers 126 and 128 are afterwards deposited over the dummy gate stacks 120A and 120B and the fin structure 106C, in accordance with some embodiments. The spacer layers 126 and 128 extend along the tops and sidewalls of the dummy gate stacks 120A and 120B, as shown in FIG. 3B. The spacer layers 126 and 128 extend along the top of the fin structure 106C, as shown in FIG. 3B.

The spacer layers 126 and 128 are made of different materials. The spacer layer 126 may be made of a dielectric material that has a low dielectric constant. The spacer layer 126 may be made of or include silicon carbide, silicon oxycarbide, carbon-containing silicon oxynitride, silicon oxide, one or more other suitable materials, or a combination thereof. In some embodiments, the spacer layer 126 is a single layer. In some other embodiments, the spacer layer 126 includes multiple sub-layers. Some of the sub-layers may be made of different materials. Some of the sub-layers may be made of similar materials with different compositions. For example, one of the sub-layers may have a greater atomic concentration of carbon than other sub-layers.

The spacer layer 128 may be made of a dielectric material that can provide more protection to the gate stacks during subsequent processes. The spacer layer 128 may have a greater dielectric constant than that of the spacer layer 126. The spacer layer 128 may be made of silicon nitride, silicon oxynitride, carbon-containing silicon nitride, carbon-containing silicon oxynitride, one or more other suitable materials, or a combination thereof. The spacer layers 126 and 128 may be sequentially deposited using a CVD process, an ALD process, a physical vapor deposition (PVD) process, one or more other applicable processes, or a combination thereof.

Figures 3C, 3D:
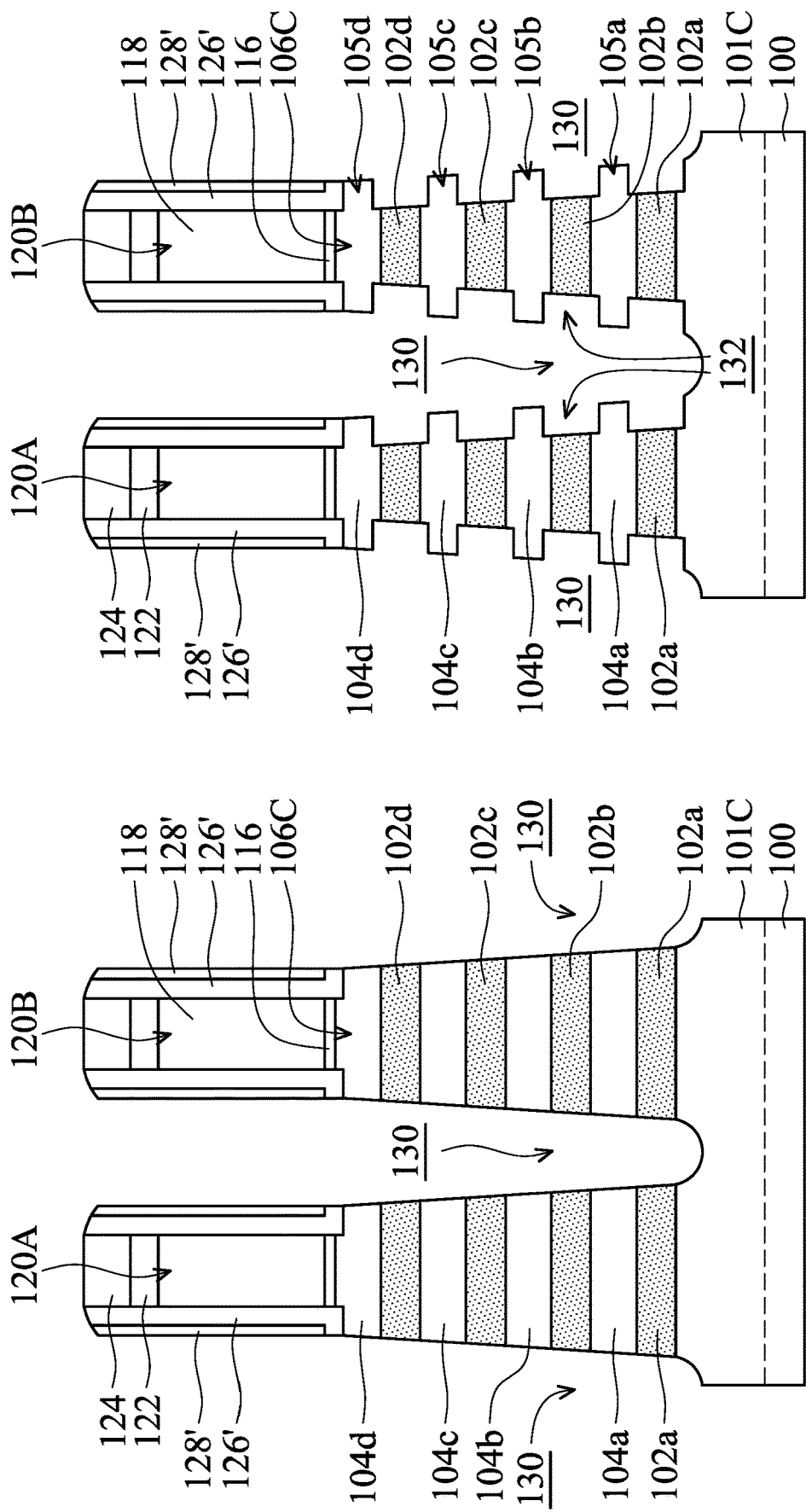
FIGS. 3A-3R are cross-sectional views of various stages of a process for forming a portion of a semiconductor device structure, in accordance with some embodiments.

As shown in FIG. 3C, the spacer layers 126 and 128 are partially removed, in accordance with some embodiments. One or more anisotropic etching processes may be used to partially remove the spacer layers 126 and 128. As a result, remaining portions of the spacer layers 126 and 128 form spacer elements 126' and 128', respectively. The spacer elements 126' and 128' extend along the sidewalls of the dummy gate stacks 120A and 120B, as shown in FIG. 3C.

Afterwards, the fin structures 106A-106E are partially removed to form recesses used for containing subsequently formed epitaxial structures. As shown in FIG. 3C, the fin structure 106C is partially removed to form recesses 130, in accordance with some embodiments. The recesses 130 may be used to contain epitaxial structures (such as source/drain structures) that will be formed later. One or more etching processes may be used to form the recesses 130. In some embodiments, a dry etching process is used to form the recesses 130. Alternatively, a wet etching process may be used to form the recesses 130. In some embodiments, each of the recesses 130 penetrates into the fin structure 106C. In some embodiments, the recesses 130 further extend into the semiconductor fin 101C, as shown in FIG. 3C. In some embodiments, the spacer elements 126' and 128' and the recesses 130 are simultaneously formed using the same etching process.

In some embodiments, each of the recesses 130 has slanted sidewalls. Upper portions of the recesses 130 are larger (or wider) than lower portions of the recesses 130. In these cases, due to the profile of the recesses 130, an upper semiconductor layer (such as the semiconductor layer 104d) is shorter than a lower semiconductor layer (such as the semiconductor layer 104b).

However, embodiments of the disclosure have many variations. In some other embodiments, the recesses 130 have substantially vertical sidewalls. In these cases, due to the profile of the recesses 130, an upper semiconductor layer (such as the semiconductor layer 104d) is substantially as wide as a lower semiconductor layer (such as the semiconductor layer 104b).

As shown in FIG. 3D, the semiconductor layers 102a-102d are laterally etched, in accordance with some embodiments. As a result, edges of the semiconductor layers 102a-102d retreat from edges of the semiconductor layers 104a-104d. As shown in FIG. 3D, recesses 132 are formed due to the lateral etching of the semiconductor layers 102a-102d. The recesses 132 may be used to contain inner spacers that will be formed later. The semiconductor layers 102a-102d may be laterally etched using a wet etching process, a dry etching process, or a combination thereof. In some other embodiments, the semiconductor layers 102a-102d are partially oxidized before being laterally etched.

During the lateral etching of the semiconductor layers 102a-102d, the semiconductor layers 104a-104d may also be slightly etched. As a result, edge portions of the semiconductor layers 104a-104d are partially etched and thus shrink to become edge elements 105a-105d, as shown in FIG. 3D. As shown in FIG. 3D, each of the edge elements 105a-105d of the semiconductor layers 104a-104d is thinner than the corresponding inner portion of the semiconductor layers 104a-104d.

Figures 3E, 3F:
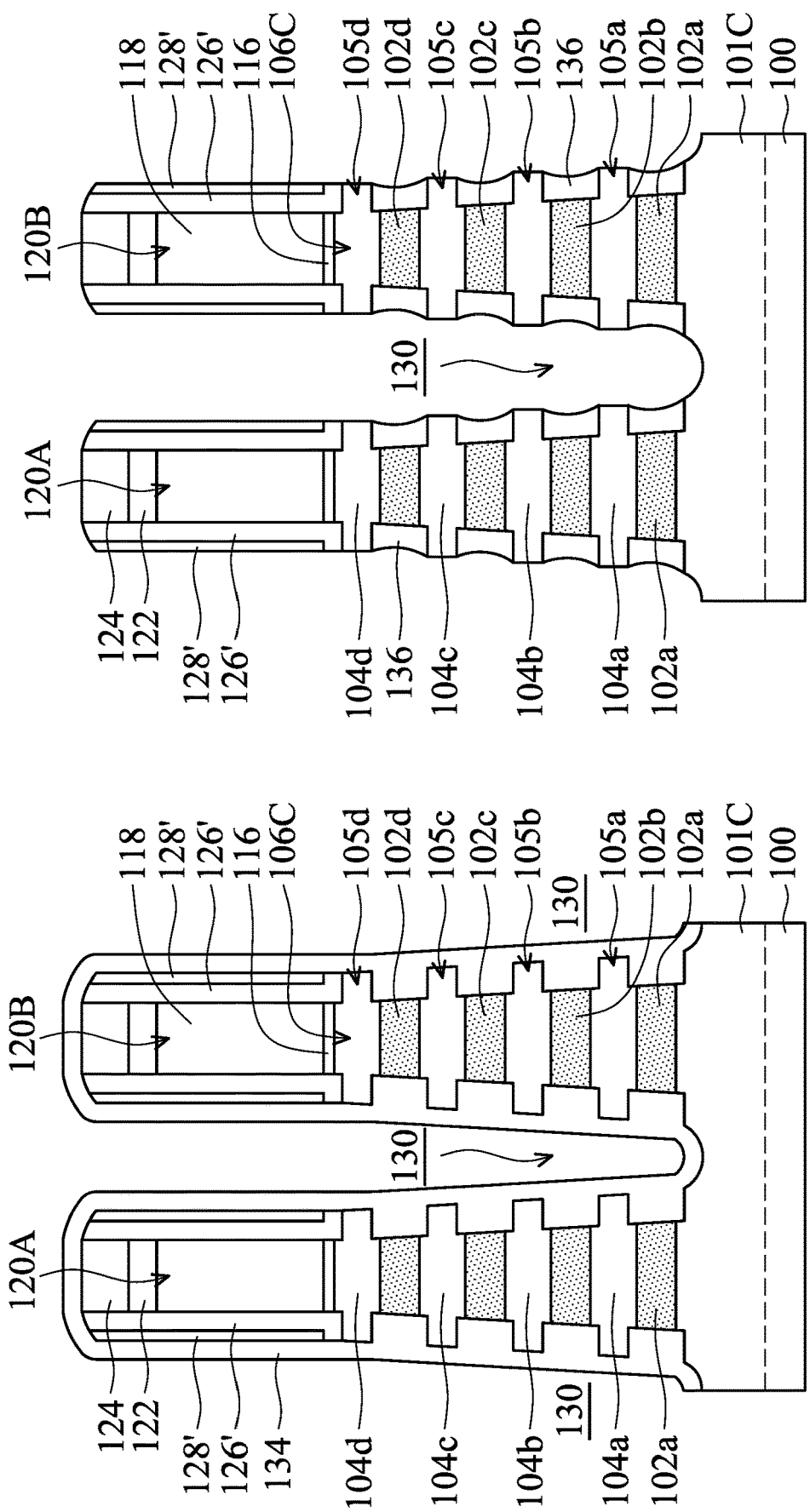

As shown in FIG. 3E, an insulating layer 134 is deposited over the structure shown in FIG. 3D, in accordance with some embodiments. The insulating layer 134 covers the dummy gate stacks 120A and 120B and fills the recesses 132. The insulating layer 134 may be made of or include carbon-containing silicon nitride (SiCN), carbon-containing silicon oxynitride (SiOCN), carbon-containing silicon oxide (SiOC), silicon oxide, silicon nitride, one or more other suitable materials, or a combination thereof. In some embodiments, the insulating layer 134 is a single layer. In some other embodiments, the insulating layer 134 includes multiple sub-layers. Some of the sub-layers may be made of different materials and/or contain different compositions. The insulating layer 134 may be deposited using a CVD process, an ALD process, one or more other applicable processes, or a combination thereof.

As shown in FIG. 3F, an etching process is used to partially remove the insulating layer 134, in accordance with some embodiments. The portions of the insulating layer 134 outside of the recesses 132 may be removed. The remaining portions of the insulating layer 134 form inner spacers 136, as shown in FIG. 3F. The etching process may include a dry etching process, a wet etching process, or a combination thereof.

The inner spacers 136 cover the edges of the semiconductor layers 102a-102d. The inner spacers 136 may be used to prevent subsequently formed epitaxial structures (which function as source/drain structures, for example) from being damaged during a subsequent process for removing the sacrificial layers 102b-102d. In some embodiments, the inner spacers 136 are made of a low-k material that has a lower dielectric constant than that of silicon oxide. In these cases, the inner spacers 136 may also be used to reduce parasitic capacitance between the subsequently formed source/drain structures and the gate stacks. As a result, the operation speed of the semiconductor device structure may be improved.

In some embodiments, after the etching process for forming the inner spacers 136, portions of the semiconductor fin 101C originally covered by the insulating layer 134 are exposed by the recesses 130, as shown in FIG. 3F. The edges of the semiconductor layers 104a-104d are exposed by the recesses 130, as shown in FIG. 3F.

As shown in FIG. 3G, epitaxial structures 138 are formed, in accordance with some embodiments. In some embodiments, the epitaxial structures 138 fill the recesses 130, as shown in FIG. 3G. In some other embodiments, the epitaxial structures 138 overfill the recesses 130. In these cases, the top surfaces of the epitaxial structures 138 may be higher than the top surface of the dummy gate dielectric layer 116. In some other embodiments, the epitaxial structures 138 partially fill the recesses 130.

In some embodiments, the epitaxial structures 138 connect to the semiconductor layers 104a-104d. Each of the semiconductor layers 104a-104d is sandwiched between two of the epitaxial structures 138. In some embodiments, the epitaxial structures 138 are p-type doped regions. The epitaxial structures 138 may include epitaxially grown silicon germanium (SiGe), epitaxially grown silicon, or another suitable epitaxially grown semiconductor material.

However, embodiments of the disclosure are not limited thereto. In some other embodiments, the epitaxial structures 138 are n-type doped regions. For example, the epitaxial structures 138 formed on the second doped region $W_P$ may be n-type doped regions. The epitaxial structures 138 may include epitaxially grown silicon, epitaxially grown silicon carbide (SiC), epitaxially grown germanium, or another suitable epitaxially grown semiconductor material.

In some embodiments, the epitaxial structures 138 are doped in-situ during their epitaxial growth. The initial reaction gas mixture for forming the epitaxial structures 138 contains dopants. In some other embodiments, the epitaxial structures 138 are not doped during the growth of the epitaxial structures 138. Instead, after the formation of the epitaxial structures 138, the epitaxial structures 138 are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 138 are further exposed to one or more annealing processes to activate the dopants. For example, a rapid thermal annealing process is used.

As shown in FIG. 3H, a contact etch stop layer 139 and a dielectric layer 140 are formed to cover the epitaxial structures 138, and to surround the dummy gate stacks 120A and 120B, in accordance with some embodiments. The contact etch stop layer 139 may be made of or include silicon nitride, silicon oxynitride, silicon carbide, aluminum oxide, one or more other suitable materials, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, an etch stop material layer and a dielectric material layer are sequentially deposited over the structure shown in FIG. 3G. The etch stop material layer may be deposited using a CVD process, an ALD process, a PVD process, one or more other applicable processes, or a combination thereof. The dielectric material layer may be deposited using an FCVD process, a CVD process, an ALD process, one or more other applicable processes, or a combination thereof.

Afterwards, a planarization process is used to partially remove the etch stop material layer and the dielectric material layer. As a result, the remaining portions of the etch stop material layer and the dielectric material layer respectively form the contact etch stop layer 139 and the dielectric layer 140, as shown in FIG. 3H. The planarization process may include a CMP process, a grinding process, an etching process, a dry polishing process, one or more other applicable processes, or a combination thereof. In some embodiments, the mask layers 122 and 124 are removed during the planarization process. In some embodiments, after the planarization process, the top surfaces of the contact etch stop layer 139, the dielectric layer 140, and the dummy gate electrodes 118 are substantially level with each other.

Figures 3I, 3J:
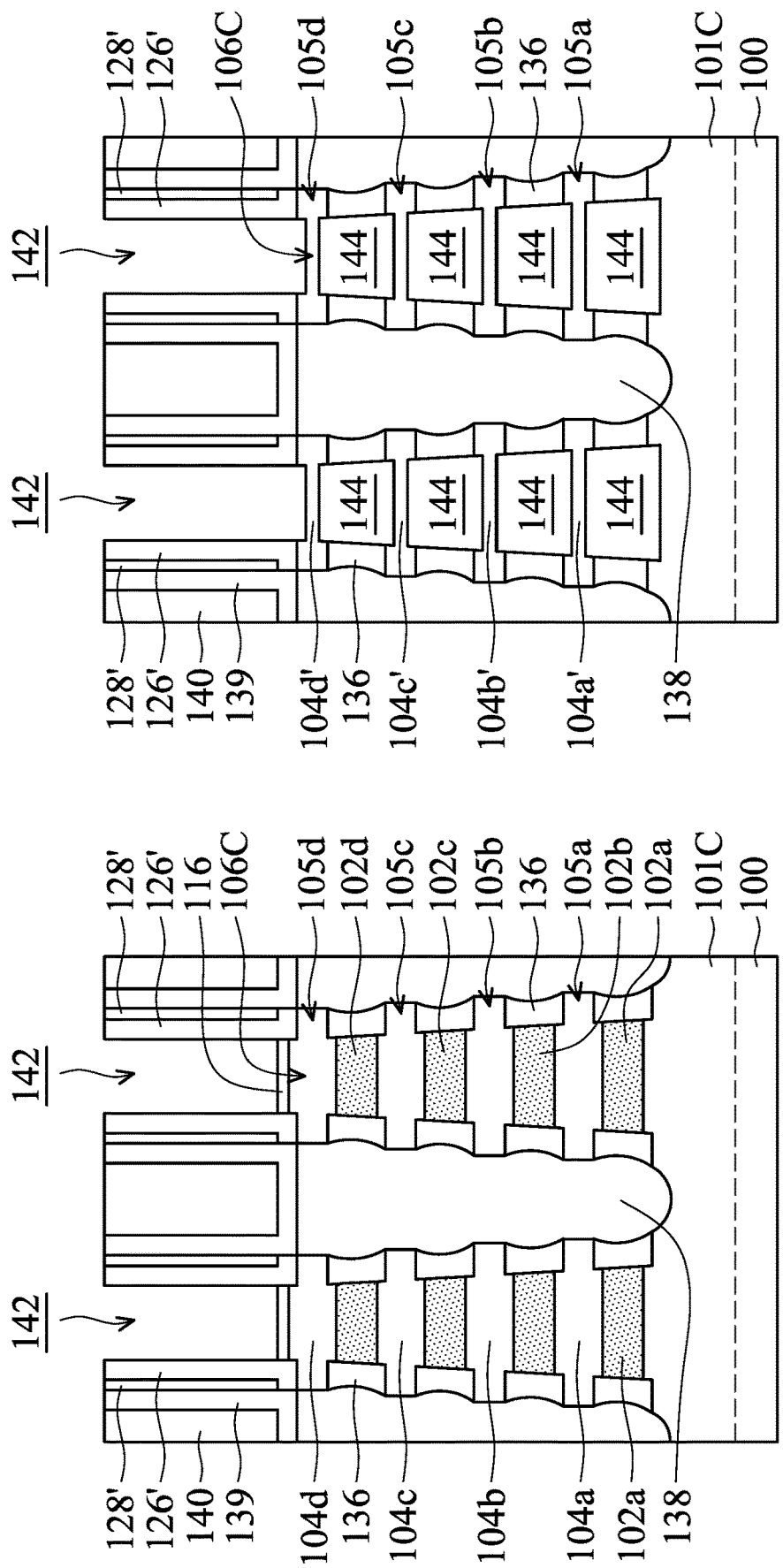
Figure 3L:
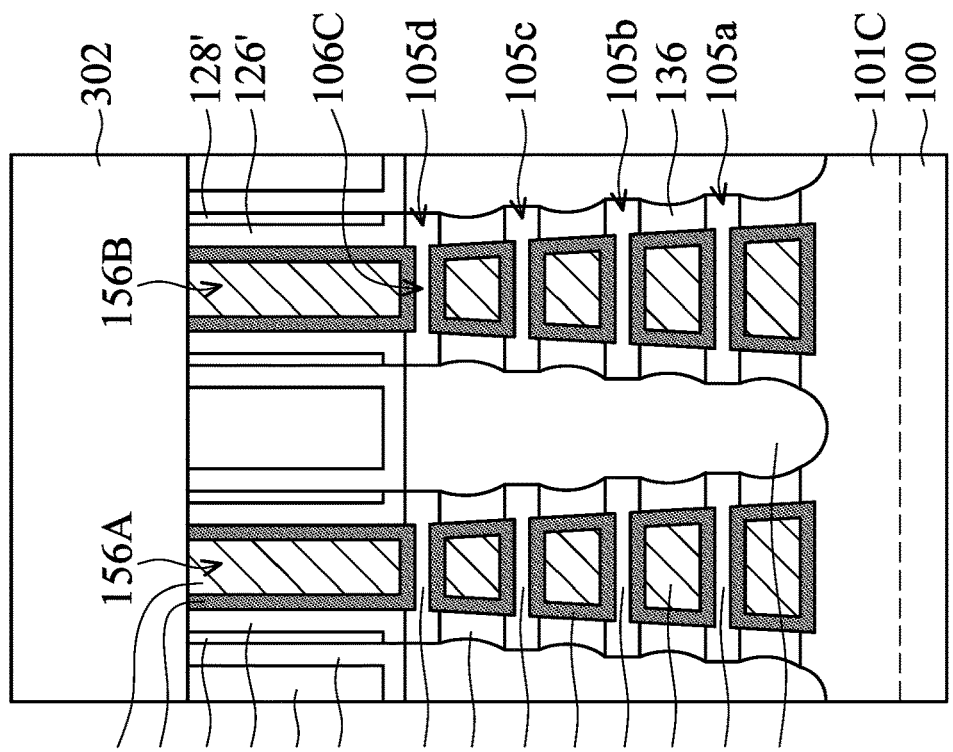

As shown in FIG. 3I, the dummy gate electrodes 118 are removed to form trenches 142 using one or more etching processes, in accordance with some embodiments. The trenches 142 are surrounded by the dielectric layer 140. The trenches 142 expose the dummy gate dielectric layer 116.

As shown in FIG. 3J, the dummy gate dielectric layer 116 and the semiconductor layers 102a-102d (which function as sacrificial layers) are removed, in accordance with some embodiments. In some embodiments, one or more etching processes are used to remove the dummy gate dielectric layer 116 and the semiconductor layers 102a-102d. As a result, recesses 144 are formed, as shown in FIG. 3J.

Due to high etching selectivity, the semiconductor layers 104a-104d are slightly (or substantially not) etched. The remaining portions of the semiconductor layers 104a-104d form multiple semiconductor nanostructures 104a'-104d'. The semiconductor nanostructures 104a'-104d' are constructed by or made up of the remaining portions of the semiconductor layers 104a-104d. The semiconductor nanostructures 104a'-104d' suspended over the semiconductor fin 101C may function as channel structures of transistors.

In some embodiments, the etchant used for removing the semiconductor layers 102a-102d also slightly removes the semiconductor layers 104a-104d that form the semiconductor nanostructures 104a'-104d'. As a result, the obtained semiconductor nanostructures 104a'-104d' become thinner after the removal of the semiconductor layers 102a-102d. In some embodiments, each of the semiconductor nanostructures 104a'-104d' is thinner than the edge portions 105a-105d since the edge portions 105a-105d are surrounded by other elements and thus are prevented from being reached and etched by the etchant.

After the removal of the semiconductor layers 102a-102d (which function as sacrificial layers), the recesses 144 are formed. The recesses 144 connect to the trench 142 and surround each of the semiconductor nanostructures 104a'-104d'. Even if the recesses 144 between the semiconductor nanostructures 104a'-104d' are formed, the semiconductor nanostructures 104a'-104d' remain held by the epitaxial structures 138. Therefore, after the removal of the semiconductor layers 102a-102d (which function as sacrificial layers), the released semiconductor nanostructures 104a'-104d' are prevented from falling.

During the removal of the semiconductor layers 102a-102d (which function as sacrificial layers), the inner spacers 136 protect the epitaxial structures 138 from being etched or damaged. The quality and reliability of the semiconductor device structure are improved.

Figure 3K:
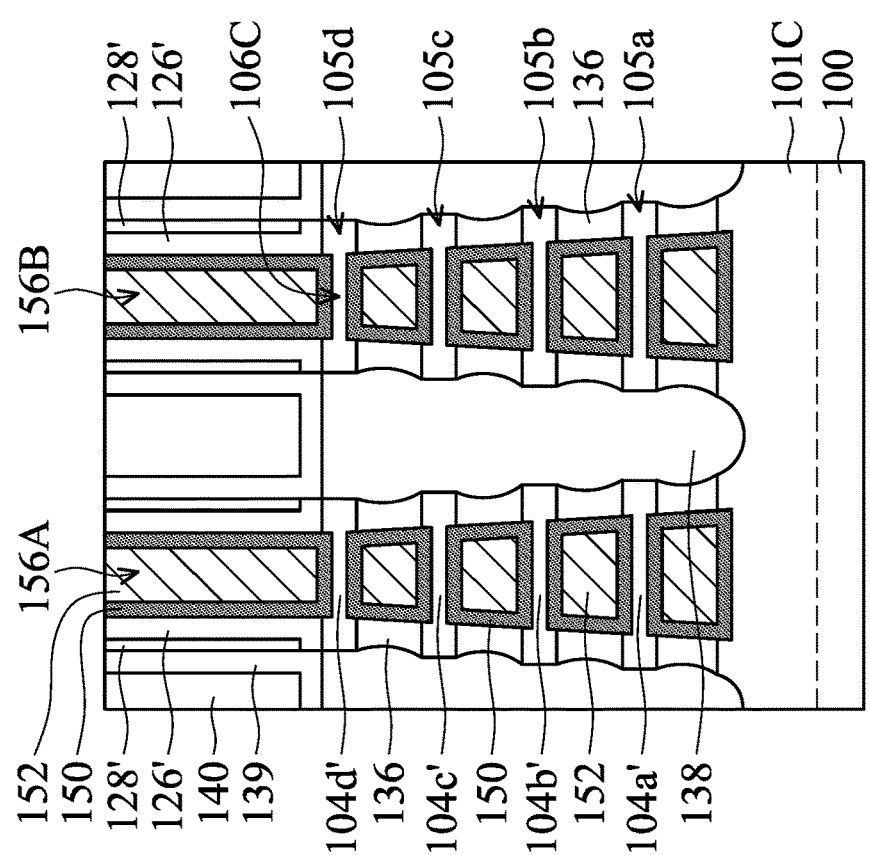

As shown in FIG. 3K, metal gate stacks 156A and 156B are formed to fill the trenches 142, in accordance with some embodiments. The metal gate stacks 156A and 156B further extend into the recesses 144 to wrap around each of the semiconductor nanostructures 104a'-104d'.

Each of the metal gate stacks 156A and 156B includes multiple metal gate stack layers. Each of the metal gate stacks 156A and 156B may include a gate dielectric layer 150 and a metal gate electrode 152. The metal gate electrode 152 may include a work function layer. The metal gate electrode 152 may further include a conductive filling. In some embodiments, the formation of the metal gate stacks 156A and 156B involves the deposition of multiple metal gate stack layers over the dielectric layer 140 to fill the trenches 142 and the recesses 144. The metal gate stack layers extend into the recesses 144 to wrap around each of the semiconductor nanostructures 104a'-104d'.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, one or more other applicable processes, or a combination thereof.

In some embodiments, before the formation of the gate dielectric layer 150, an interfacial layers are formed on the surfaces of the semiconductor nanostructures 104a'-104d'. The interfacial layers are very thin and are made of, for example, silicon oxide or germanium oxide. In some embodiments, the interfacial layers are formed by applying an oxidizing agent on the surfaces of the semiconductor nanostructures 104a'-104d'. For example, a hydrogen peroxide-containing liquid may be applied or provided on the surfaces of the semiconductor nanostructures 104a'-104d' so as to form the interfacial layers.

The work function layer of the metal gate electrode 152 may be used to provide the desired work function for transistors to enhance device performance including improved threshold voltage. In some embodiments, the work function layer is used for forming a PMOS device. The work function layer is a p-type work function layer. The p-type work function layer is capable of providing a work function value suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, one or more other suitable materials, or a combination thereof.

In some other embodiments, the work function layer is used for forming an NMOS device. The work function layer is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level.

The work function layer may be deposited over the gate dielectric layer 150 using an ALD process, a CVD process, a PVD process, an electroplating process, an electroless plating process, one or more other applicable processes, or a combination thereof.

In some embodiments, a barrier layer is formed before the work function layer to interface the gate dielectric layer 150 with the subsequently formed work function layer. The barrier layer may also be used to prevent diffusion between the gate dielectric layer 150 and the subsequently formed work function layer. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive fillings of the metal gate electrodes 152 are made of or include a metal material. The metal material may include tungsten, aluminum, copper, cobalt, one or more other suitable materials, or a combination thereof. A conductive layer used for forming the conductive filling may be deposited over the work function layer using a CVD process, an ALD process, a PVD process, an electroplating process, an electroless plating process, a spin coating process, one or more other applicable processes, or a combination thereof.

In some embodiments, a blocking layer is formed over the work function layer before the formation of the conductive layer used for forming the conductive filling. The blocking layer may be used to prevent the subsequently formed conductive layer from diffusing or penetrating into the work function layer. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trenches 142, in accordance with some embodiments. As a result, the remaining portions of the metal gate stack layers form the metal gate stacks 156A and 156B, as shown in FIG. 3K.

In some embodiments, the conductive filling does not extend into the recesses 144 since the recesses 144 are small and have been filled with other elements such as the gate dielectric layer 150 and the work function layer. However, embodiments of the disclosure are not limited thereto. In some other embodiments, a portion of the conductive filling extends into the recesses 144, especially for the lower recesses 144 that may have larger space.

As shown in FIG. 3L, a dielectric layer 302 is deposited over the dielectric layer 140 and the metal gate stacks 156A and 156B, in accordance with some embodiments. The material and formation method of the dielectric layer 302 may be the same as or similar to those of the dielectric layer 10. In some embodiments, the entirety of the dielectric layer 302 is integrally formed. In these cases, the dielectric layer 302 is a single layer. In some embodiments, the dielectric layer 302 is in direct contact with the dielectric layer 140 and the metal gate stacks 156A and 156B, as shown in FIG. 3L.

However, embodiments of the disclosure are not limited thereto. Many variations and/or modifications can be made to embodiments of the disclosure. In some other embodiments, before the formation of the dielectric layer 302, an etch stop layer is deposited over the dielectric layer 140 and the metal gate stacks 156A and 156B. In these cases, the dielectric layer 302 is separated from the dielectric layer 140 and the metal gate stacks 156A and 156B by the etch stop layer.

In some embodiments, no etching back process is performed to the metal gate stacks 156A and 156B to recess the metal gate stacks 156A and 156B before the formation of the dielectric layer 302. In some embodiments, the topmost surfaces of the metal gate stacks 156A and 156B are thus substantially level with the topmost surfaces of the spacer elements 126' and 128', as shown in FIG. 3L. In some embodiments, the topmost surfaces of the metal gate stacks 156A and 156B are substantially level with the topmost surfaces of the dielectric layer 140.

Figure 3M:
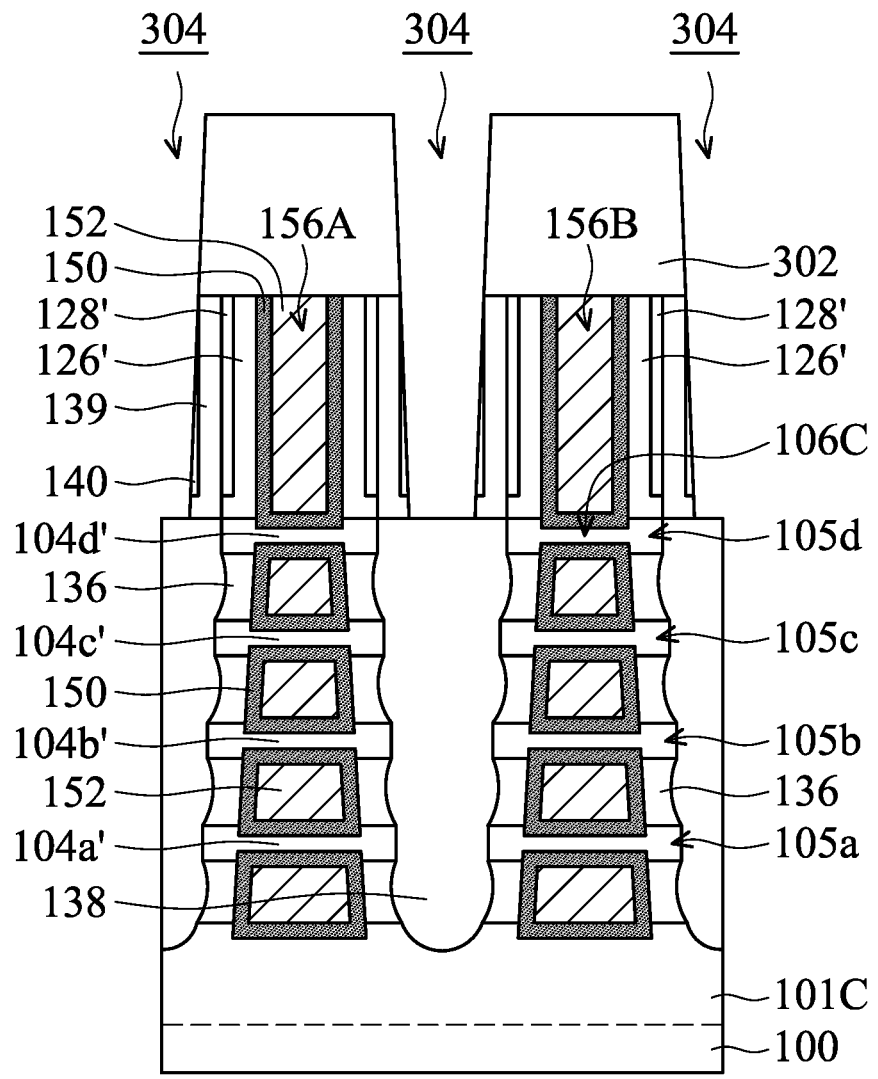

As shown in FIG. 3M, the dielectric layer 302, the dielectric layer 140, and the etch stop layer 139 are partially removed to form contact openings 304, in accordance with some embodiments. In some embodiments, the contact openings 304 penetrate through the dielectric layer 302, the dielectric layer 140, and the etch stop layer 139. As a result, the epitaxial structures 138 are exposed by the contact openings 304. One or more photolithography processes and one or more etching processes may be used to form the contact openings 304.

Figure 3N:
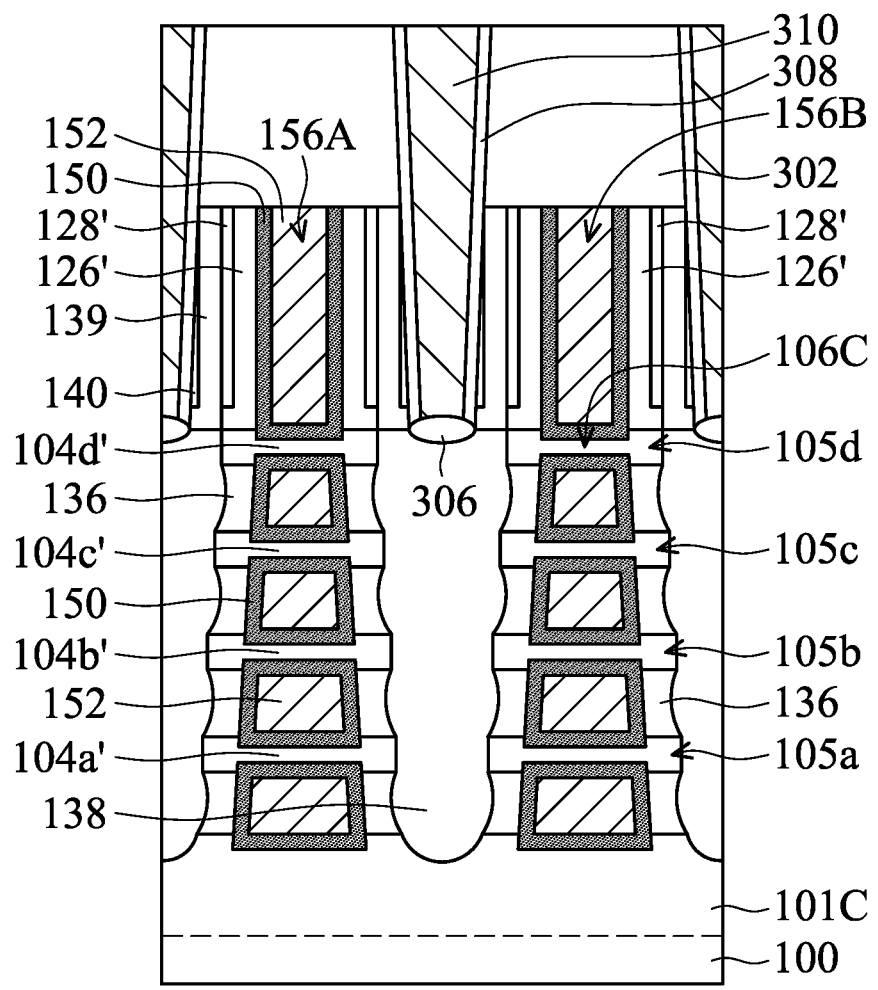

As shown in FIG. 3N, metal-semiconductor compound elements 306 are formed on the surfaces of the epitaxial structures 138 that are exposed by the contact openings 304, in accordance with some embodiments. In some embodiments, before the formation of the metal-semiconductor compound elements 306, the exposed epitaxial structures 138 are modified to assist in the subsequent formation of the metal-semiconductor compound elements 306. In some embodiments, one or more ion implantation processes are used to reduce the crystallinity of the surface portions of the epitaxial structures 138, which allows a subsequently deposited metal material to react with the modified surface portions more easily. The formation of the metal-semiconductor compound elements 306 may thus be facilitated.

In some embodiments, the implantation process is a plasma doping process. Plasma may be introduced into the contact openings 304 to modify the exposed surface portions of the epitaxial structures 138. In some embodiments, reaction gas used in the implantation process includes silicon-containing gas, germanium-containing gas, argon-containing gas, helium-containing gas, one or more other suitable gases, or a combination thereof.

In some embodiments, a metal-containing material is applied (or deposited) on the epitaxial structures 138 while the epitaxial structures 138 is heated, in accordance with some embodiments. In some embodiments, the metal-containing material is applied (or deposited) using a CVD process. In some embodiments, the metal-containing material is applied (or deposited) using an atomic layer deposition process. Because the metal-containing material is applied during the heating of the epitaxial structures 138, the thermal energy may help to initiate chemical reaction between the surface portions of the epitaxial structures 138 and the metal-containing material. As a result, the surface portions of the epitaxial structures 138 react with the metal-containing material, and they are transformed into the metal-semiconductor compound elements 306. The metal-semiconductor compound elements 306 may be made of or include a metal silicide material, a silicon-germanium-metal-containing material, a germanium-metal-containing material, one or more other suitable materials, or a combination thereof.

As mentioned above, the metal-containing material is applied (or deposited) on the epitaxial structures 138 while the epitaxial structures 138 are heated. In some embodiments, the epitaxial structures 138 are heated to a temperature that is in a range from about 390 degrees C. to about 440 degrees C. In some embodiments, before the metal-containing material is applied (or deposited) on the epitaxial structures 138, the epitaxial structures 138 are heated to be at a raised temperature. Afterwards, the epitaxial structures 138 are kept at the raised temperature while the metal-containing material is applied (or deposited). The raised temperature may be in a range from about 390 degrees C. to about 440 degrees C.

In some embodiments, while applying or depositing the metal-containing material for forming the metal-semiconductor compound elements 306, the metal-containing material is also applied (or deposited) on sidewalls and bottom surfaces of the contact openings 304 to form metal layers. The metal layers may be made of or include titanium, cobalt, nickel, tantalum, tungsten, platinum, one or more other suitable materials, or a combination thereof.

Afterwards, a modification process is used to transform the metal layers mentioned above into barrier layers 308. In some embodiments, the modification process is a plasma-involved process. In some embodiments, the modification process is a process involving nitrogen-containing plasma. In some embodiments, the reaction gases used for generating the nitrogen-containing plasma include $NH_3$, $N_2$, Ar, $H_2$, or a combination thereof. In some embodiments, the metal layers are nitrogenized by the modification process, so as to form the barrier layers 308. The barrier layers 308 may be made of or include titanium nitride, tantalum nitride, nickel nitride, cobalt nitride, one or more other suitable materials, or a combination thereof.

Embodiments of the disclosure have many variations. In some other embodiments, the metal layers are not deposited while the epitaxial structures 138 are heated. In some embodiments, a thermal operation is performed after the formation of the metal layer to initiate the formation of the metal-semiconductor compound elements 306.

However, embodiments of the disclosure are not limited thereto. Many variations and/or modifications can be made to embodiments of the disclosure. In some other embodiments, the metal-semiconductor compound elements 306 and/or the barrier layers 308 are not formed.

As shown in FIG. 3N, conductive contacts 310 are formed in the contact openings 304, in accordance with some embodiments. In some embodiments, the conductive contacts 310 completely fill the remaining portions of the contact openings 304, as shown in FIG. 3N. In some embodiments, the conductive contacts 310 penetrate through the dielectric layers 302 and 140. In some embodiments, each of the conductive contacts 310 penetrates through the bottommost surface of the dielectric layer 302. In some embodiments, each of the conductive contacts 310 is integrally formed. In some embodiments, each portion of the conductive contacts 310 has substantially the same composition. In some embodiments, the topmost surface of the metal gate stack 156B is vertically disposed between the topmost surface of the conductive contact 310 and the bottommost surface of the conductive contact 310.

In some embodiments, a conductive material layer is deposited over the barrier layers 308 and the metal-semiconductor compound elements 306 to overfill the contact openings 304, in accordance with some embodiments. The conductive material layer may be made of or include ruthenium, cobalt, tungsten, titanium, molybdenum, tantalum, tungsten, one or more other suitable materials, or a combination thereof. The conductive material layer may be deposited using an ALD process, a CVD process, a PVD process, an electroplating process, an electroless plating process, one or more other applicable processes, or a combination thereof.

Afterwards, a planarization process is used to remove the conductive material layer outside of the contact openings 304, in accordance with some embodiments. As a result, the remaining portions of the conductive material layer in the contact openings 304 form the conductive contacts 310, as shown in FIG. 3N. The planarization process mentioned above may include a CMP process, a grinding process, an etching process, a dry polishing process, one or more other applicable processes, or a combination thereof.

Figure 3O:
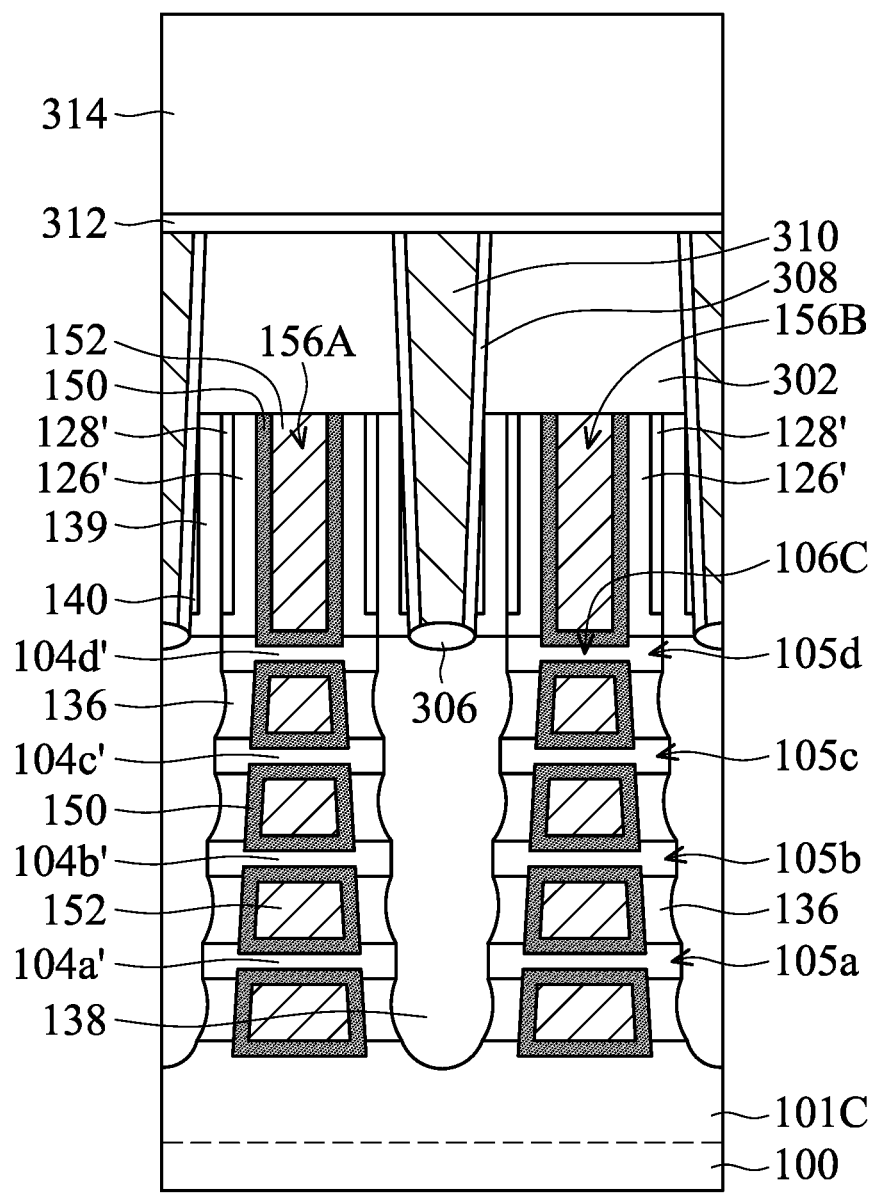

As shown in FIG. 3O, an etch stop layer 312 and a dielectric layer 314 are sequentially deposited over the structure shown in FIG. 3N, in accordance with some embodiments. The material and formation method of the etch stop layer 312 may be the same as or similar to those of the etch stop layer 139. The material and formation method of the dielectric layer 314 may be the same as or similar to those of the dielectric layer 140. In some embodiments, the entirety of the dielectric layer 314 is integrally formed.

Many variations and/or modifications can be made to embodiments of the disclosure. In some other embodiments, the etch stop layer 312 is not formed. In some other embodiments, the dielectric layer 314 is in direct contact with the dielectric layer 302.

Figure 3P:
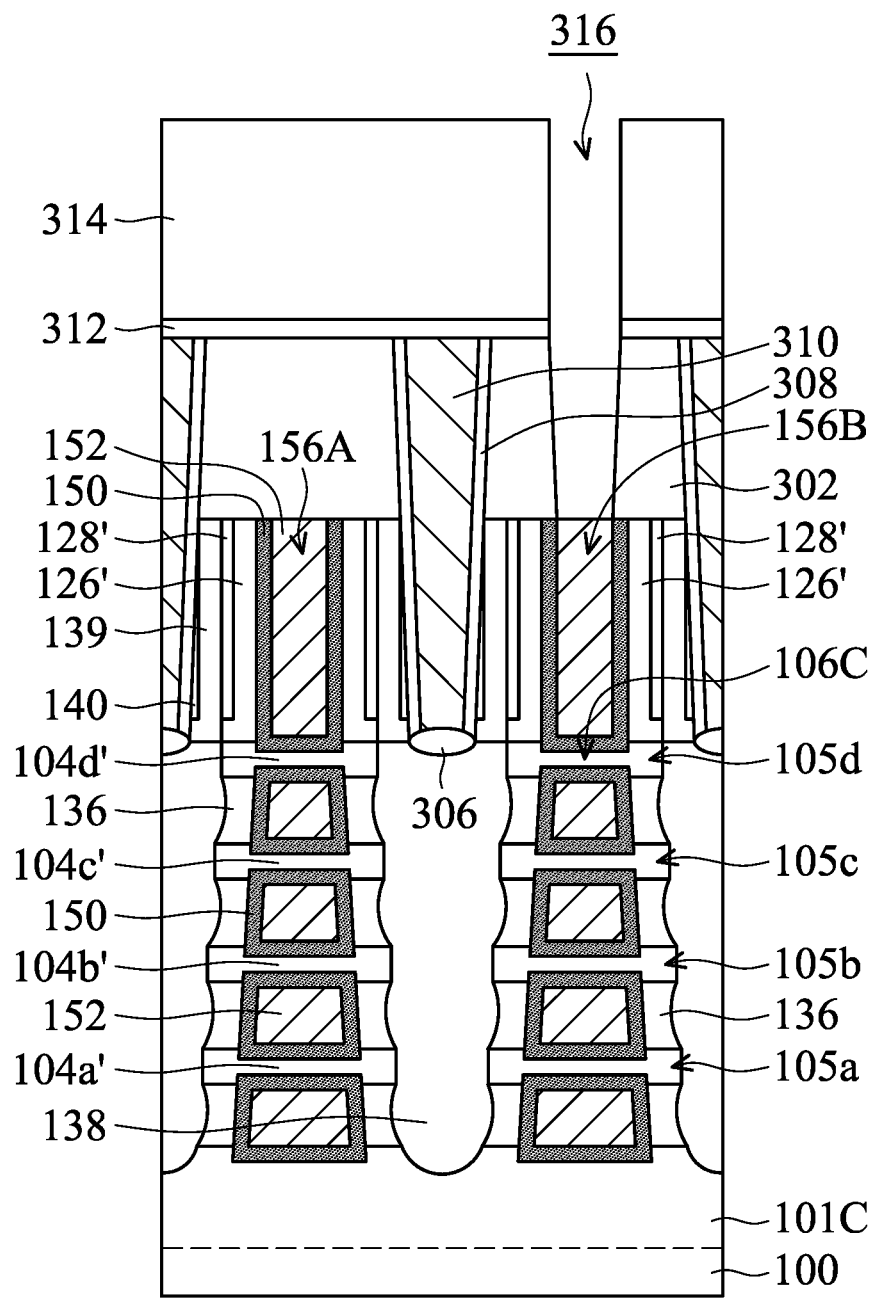

As shown in FIG. 3P, the dielectric layer 314, the etch stop layer 312, and the dielectric layer 302 are partially removed to form a via opening 316, in accordance with some embodiments. The via opening 316 exposes the metal gate stack 156B. In some embodiments, another via opening (not shown in FIG. 3P) is also formed to expose the metal gate stack 156A. The via opening exposing the metal gate stack 156A may be observed in another cross-sectional view. One or more photolithography processes and one or more etching processes may be used to form the via opening 316.

In some embodiments, the etching process used for forming the via opening 316 involves using plasma. The reaction gas mixture used for generating the plasma may include $CF_4$, $N_2$, $H_2$, $O_2$, one or more other suitable gases, or a combination thereof. The gas flow may be in a range from about 10 sccm to about 1000 sccm. The process temperature may be in a range from about 18 degrees C. to about 100 degrees C. The process pressure may be in a range from about 10 mtorr to about 1000 mtorr. The RF power may be in a range from about 100 W to about 1000 W. The processing time may be in a range from about 5 seconds to about 50 seconds.

As shown in FIG. 3P, the via opening 316 has an upper portion that is laterally surrounded by the dielectric layer 314 and a lower portion that is laterally surrounded by the dielectric layer 302. In some embodiments, the sidewall of the lower portion of the via opening 316 is steeper than the sidewall of the upper portion of the via opening 316, as shown in FIG. 3P. In some embodiments, the sidewall of the upper portion of the via opening 316 is a substantially vertical sidewall. The sidewall of the lower portion of the via opening 316 has an inclined sidewall.

In some embodiments, as shown in FIG. 3P, since the via opening 316 extends from the top surface of the dielectric layer 314, the bottom end of the via opening 316 is narrower than the top end of the via opening 316. As shown in FIG. 3P, the bottom end of the via opening 316 is also narrower than the metal gate stack 156B. Due to the narrower profile of the lower portion of the via opening 316, the conductive contact 310 is separated from a conducive via that will be formed in the via opening 316 by a longer distance. Short circuiting may thus be significantly prevented between the conductive contact 310 an the conductive via that will be formed in the via opening 316.

In some embodiments, a surface treatment is performed to modify the surface of the metal gate stack 156B that is exposed by the via opening 316. The surface treatment may help to improve the electrical connection between the metal gate stack 156B and a conductive via that will be formed in the via opening 316. In some embodiments, the surface treatment involves introducing plasma into the via opening 316 to modify the exposed surface of the metal gate stack 156B.

The reaction gas mixture used for generating the plasma may include $O_2$, $N_2$, $NH_3$, one or more other suitable gases, or a combination thereof. The gas flow may be in a range from about 10 sccm to about 1000 sccm. The process temperature may be in a range from about 150 degrees C. to about 350 degrees C. The process pressure may be in a range from about 50 mtorr to about 4000 mtorr. The RF power may be in a range from about 50 W to about 5000 W. The processing time may be in a range from about 10 seconds to about 50 seconds.

However, embodiments of the disclosure are not limited thereto. Many variations and/or modifications can be made to embodiments of the disclosure. In some other embodiments, the surface treatment is not performed. In some other embodiments, the surface treatment is not performed at this stage. The surface treatment may be performed later.

Figure 3Q:
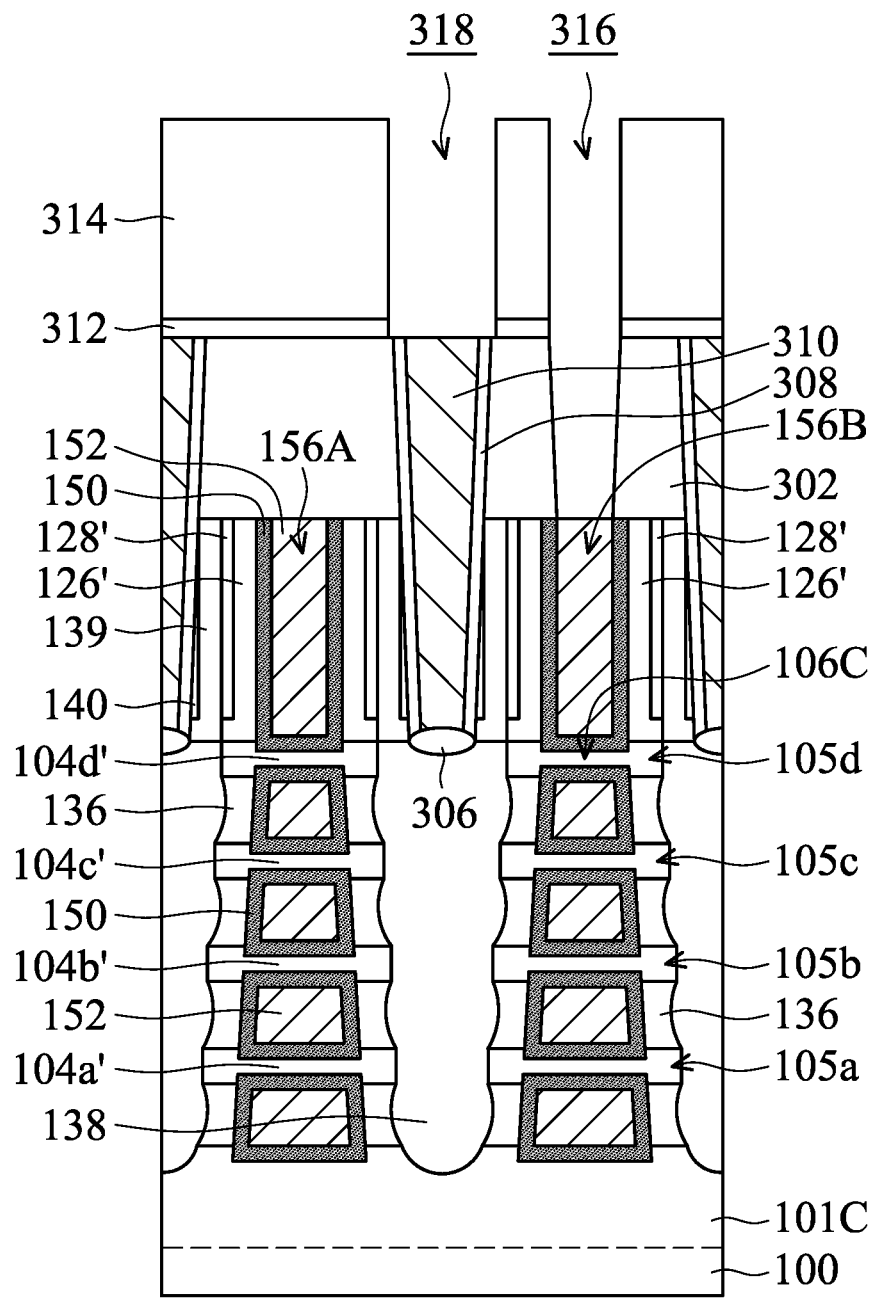
Figure 3R:
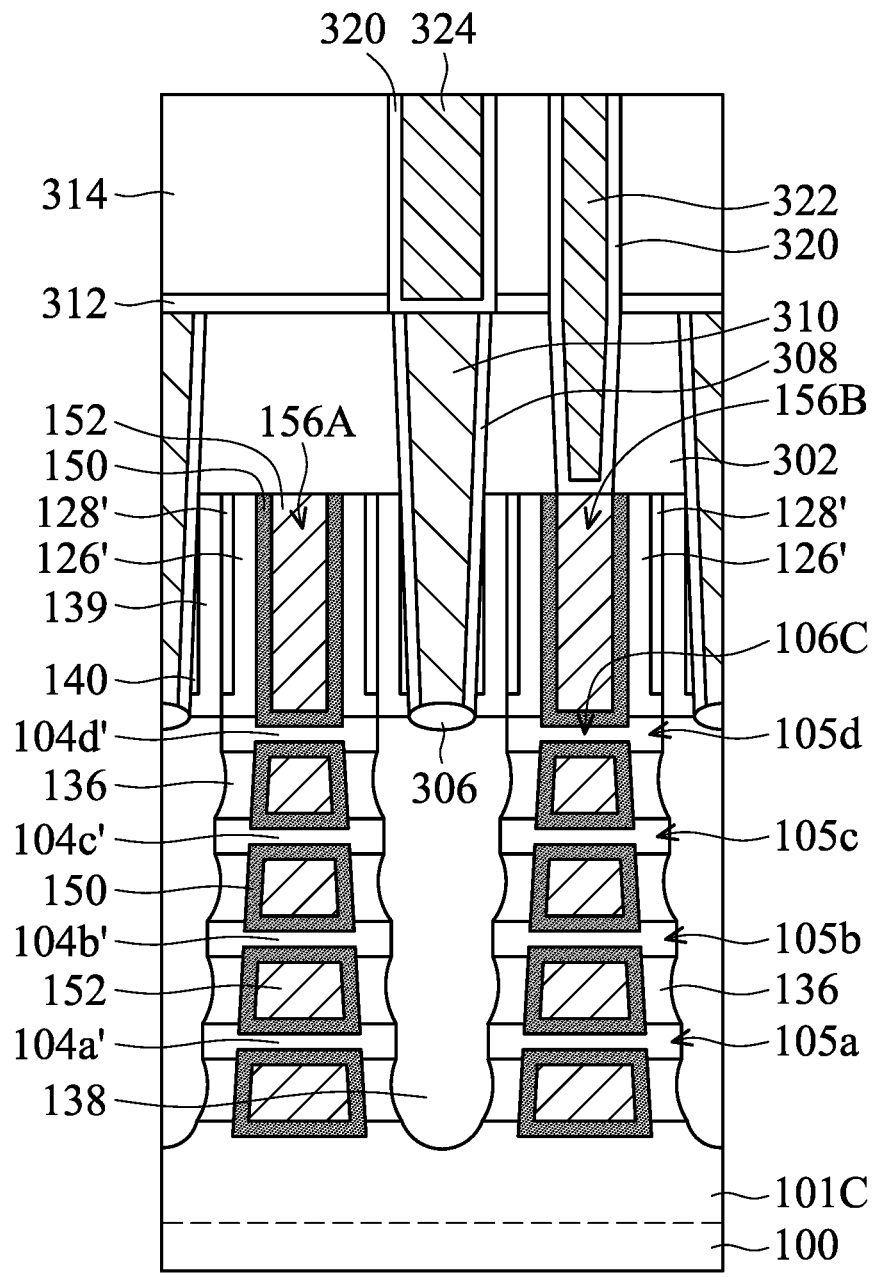

As shown in FIG. 3Q, the dielectric layer 314 and the etch stop layer 312 are partially removed to form a via opening 318, in accordance with some embodiments. The via opening 318 exposes the conductive contact 310. In some embodiments, other via openings (not shown in FIG. 3Q) are also formed to expose other conductive contacts. The via openings exposing other conductive contacts may be observed in another cross-sectional view.

One or more photolithography processes and one or more etching processes may be used to form the via opening 318. In some embodiments, a patterned photoresist layer is formed to cover the via opening 316 during the formation of the via opening 318. The etching process used for forming the via opening 318 may be the same as or similar to that for forming the via opening 316. After the formation of the via opening 318, the patterned photoresist layer is removed. In some embodiments, the sidewall of the via opening 318 is a substantially vertical sidewall.

In some embodiments, similar to the surface treatment illustrated in FIG. 3P, a surface treatment is performed to the exposed surface of the conductive contact 310. In some other embodiments, a single surface treatment is performed to modify the exposed surfaces of the conductive contact 310 and the metal gate stack 156B at the same time.

Embodiments of the disclosure are not limited thereto. Many variations and/or modifications can be made to embodiments of the disclosure. In some other embodiments, the via opening 318 is formed before the formation of the via opening 316.

As shown in FIG. 3R, glue elements 320 are formed along the sidewalls and bottoms of the via openings 316 and 318, in accordance with some embodiments. Afterwards, conductive vias 322 and 324 are respectively formed in the via openings 316 and 318, as shown in FIG. 3R in accordance with some embodiments.

As shown in FIG. 3R, the conductive via 322 has an upper portion that is laterally surrounded by the dielectric layer 314 and a lower portion that is laterally surrounded by the dielectric layer 302. In some embodiments, the sidewall of the lower portion of the conductive via 322 is steeper than the sidewall of the upper portion of the conductive via 322. In some embodiments, the sidewall of the upper portion of the conductive via 322 is a substantially vertical sidewall. In some embodiments, the sidewall of the lower portion of the conductive via 322 is an inclined sidewall. In some embodiments, the topmost surface of the conductive contact 310 is vertically disposed between the topmost surface of the conductive via 322 and the bottommost surface of the conductive via 322, as shown in FIG. 3R.

In some embodiments, a glue material layer is deposited over the dielectric layer 314. The glue material layer extends along the sidewalls and bottoms of the via openings 316 and 318. The glue material layer may be made of or include Ti, TiN, TaN, W, one or more other suitable materials, or a combination thereof. The glue material layer may be deposited using a CVD process, an ALD process, a PVD process, an electroplating process, an electroless plating process, one or more other applicable processes, or a combination thereof.

In some embodiments, a conductive material layer is then deposited over the glue material layer to overfill the via openings 316 and 318. The conductive material layer may be made of or include W, Co, Ru, one or more other suitable materials, or a combination thereof. The conductive material layer may be deposited using a CVD process, an ALD process, a PVD process, an electroplating process, an electroless plating process, one or more other applicable processes, or a combination thereof.

Afterwards, a planarization process is used to remove the portions of the glue material layer and the conductive material layer outside of the via openings 316 and 318. As a result, the remaining portions of the glue material layer in the via openings 316 and 318 form the glue elements 320. The remaining portions of the conductive material layer in the via openings 316 and 318 form the conductive vias 322 and 324, respectively. The planarization process may include CMP process, a grinding process, an etching process, a dry polishing process, one or more other applicable processes, or a combination thereof.

Many variations and/or modifications can be made to embodiments of the disclosure. In some other embodiments, the glue elements 320 are not formed.

In some embodiments, the topmost surfaces of the conductive vias 322 and 324 are substantially level with each other. In some embodiments, the topmost surfaces of the conductive vias 322 and 324 are substantially level with the topmost surface of the dielectric layer 314. In some embodiments, the entirety of the conductive via 322 is integrally formed. Each portion of the conductive via 322 may have substantially the same composition. In some embodiments, the entirety of the conductive via 324 is integrally formed. Each portion of the conductive via 324 may have substantially the same composition.

Due to the narrower profile of the lower portion of the via opening 316, the lower portion of the conductive via 322 also has a narrower width than the metal gate stack 156B. Therefore, the conductive contact 310 is separated from the conducive via 322 by a long distance. Short circuiting between the conductive contact 310 and the conductive via 322 is prevented even if an overlap shift occurs. The reliability and performance of the semiconductor device structure are greatly improved.

In the embodiments illustrated in FIG. 3A-3R, the conductive vias 322 and 324 are formed simultaneously. However, embodiments of the disclosure are not limited thereto. Many variations and/or modifications can be made to embodiments of the disclosure. In some other embodiments, the conductive vias 322 and 324 are sequentially formed.

Figure 4A:
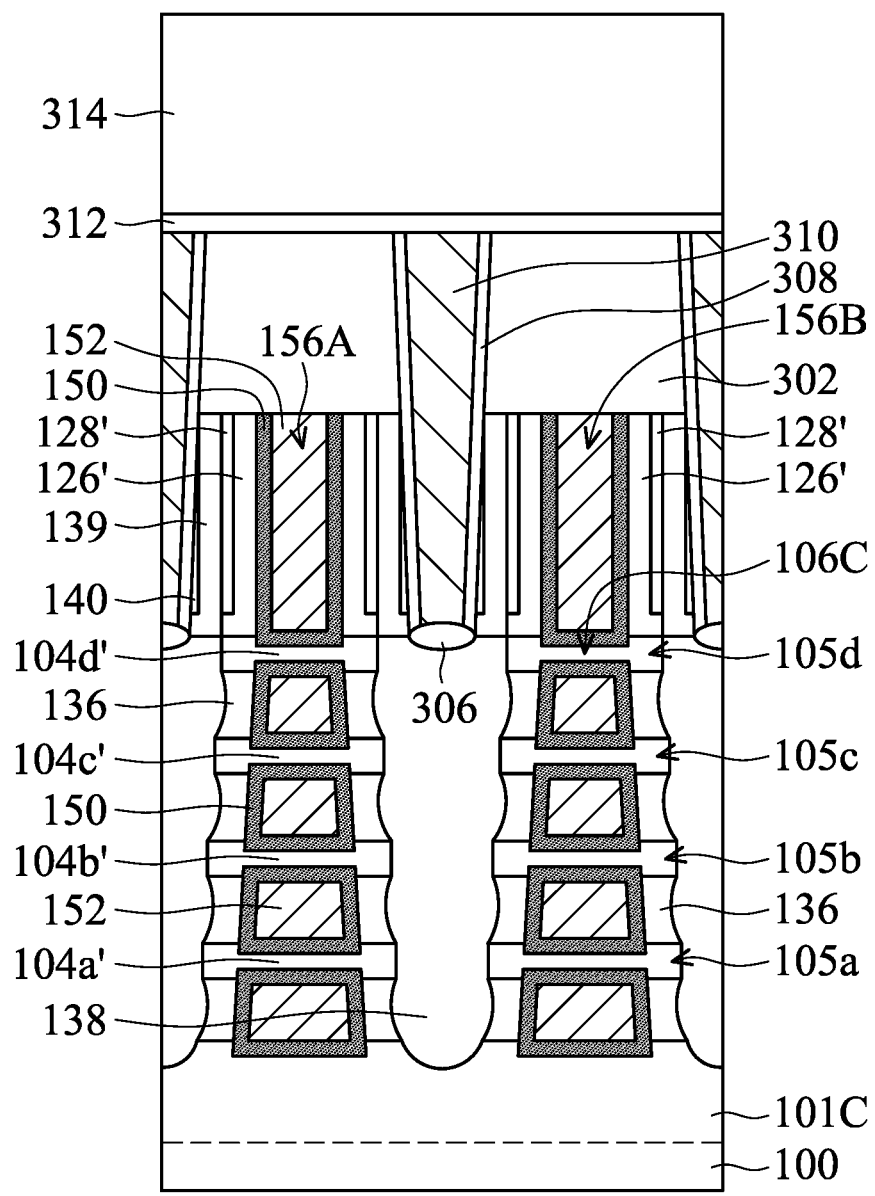
FIGS. 4A-4C are cross-sectional views of various stages of a process for forming a portion of a semiconductor device structure, in accordance with some embodiments.
Figure 4B:
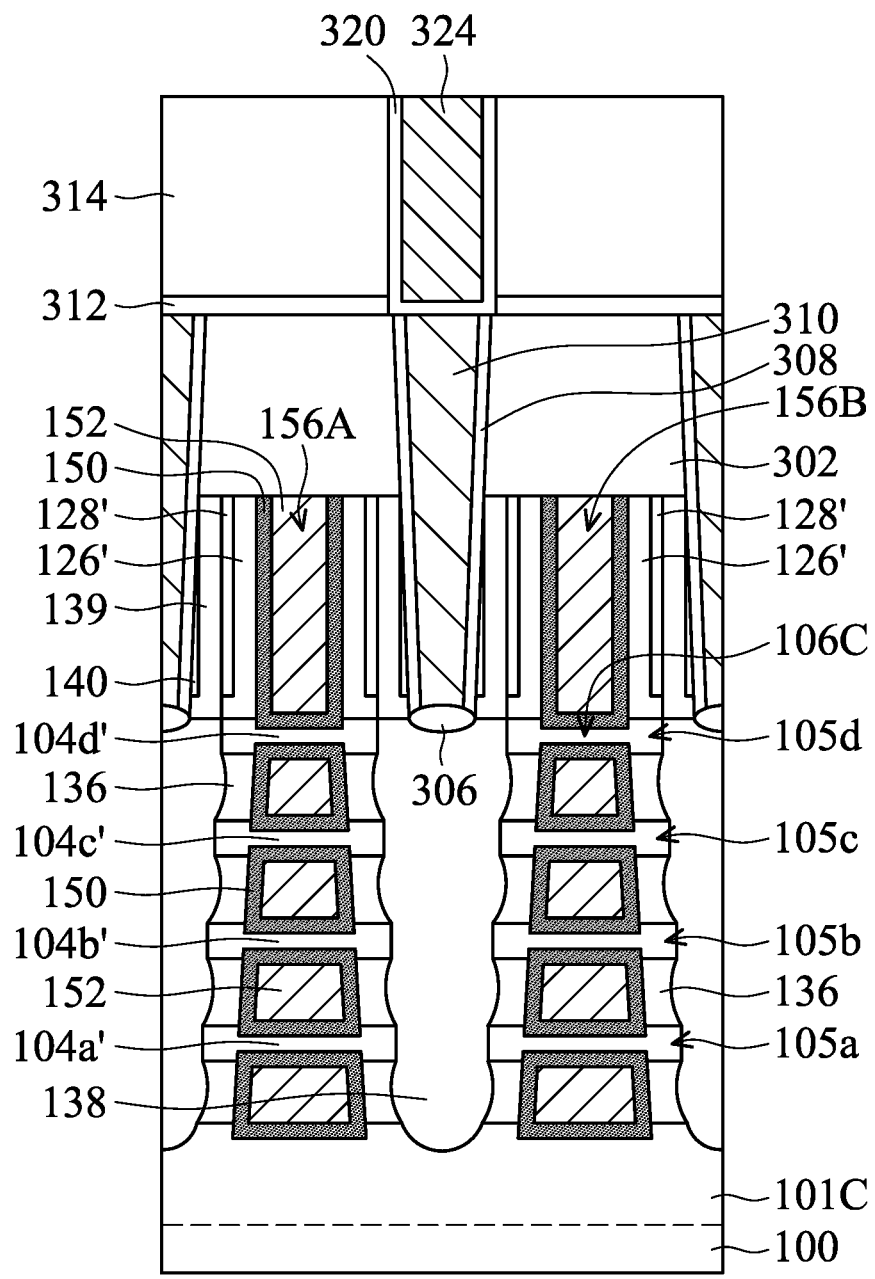
Figure 4C:
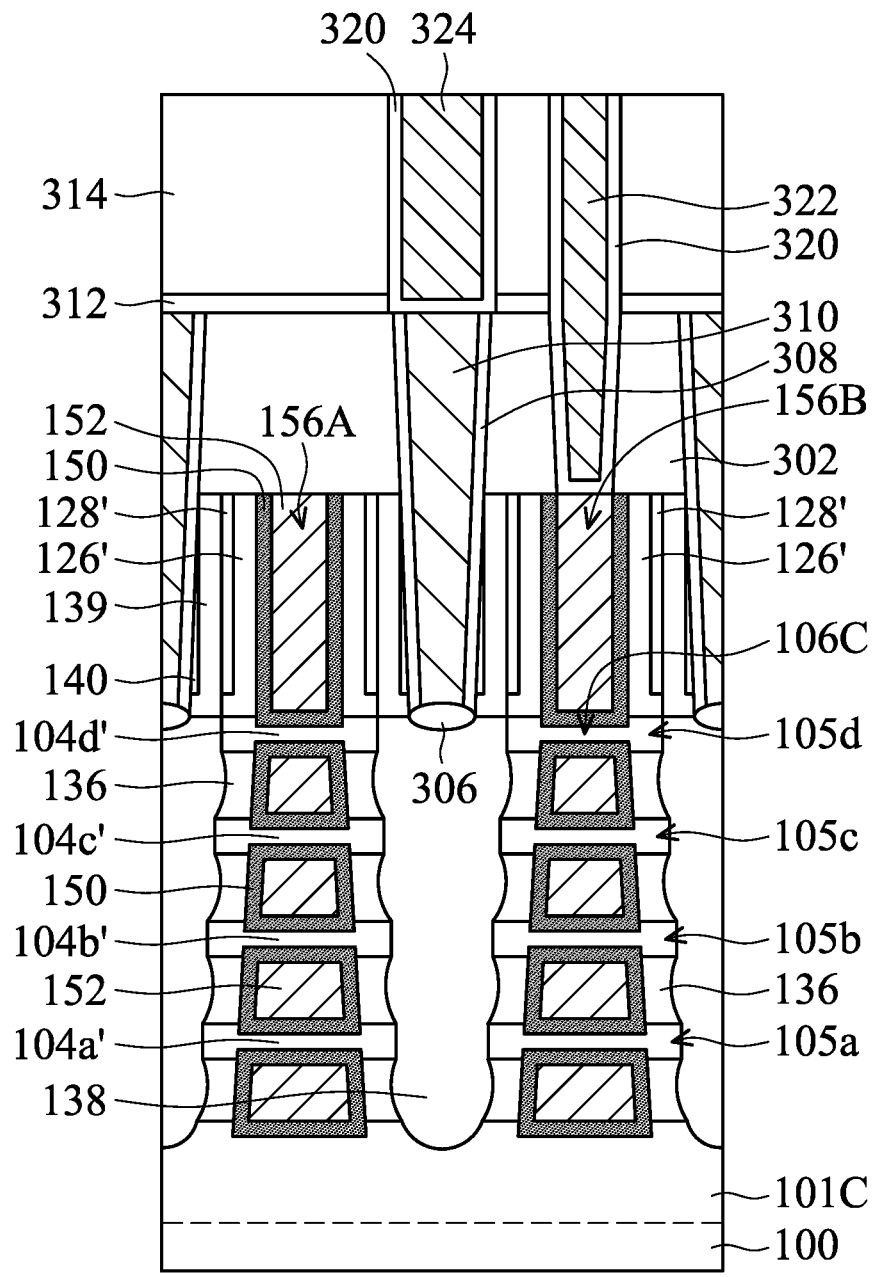

FIGS. 4A-4C are cross-sectional view of various stages of a process for forming a portion of a semiconductor device structure, in accordance with some embodiments. As shown in FIG. 4A, a structure that is the same as or similar to the structure shown in FIG. 3O is formed, in accordance with some embodiments.

As shown in FIG. 4B, similar to the embodiments illustrated in FIGS. 3Q-3R, the conductive via 324 and the glue element 320 surrounding the conductive via 324 are formed, in accordance with some embodiments. Unlike the embodiments illustrated in FIGS. 3Q-3R, the via opening 316 and the conductive via 322 have not been formed, as shown in FIG. 4B.

As shown in FIG. 4C, after the formation of the conductive via 324, the conductive via 322 and the glue element 320 surrounding the conductive via 322 are formed, in accordance with some embodiments. The formation of the conductive via 322 may be similar to the embodiments illustrated in FIGS. 3P and 3R.

Many variations and/or modifications can be made to embodiments of the disclosure. In some other embodiments, the conductive via 322 is formed before the conductive via 324. After the formation of the conductive via 322, a via opening is formed in the dielectric layer 314 to exposed the conductive contact 310. Afterwards, the vis hole is filled with suitable conductive materials. As a result, the conductive via 324 is formed.

Figure 5:
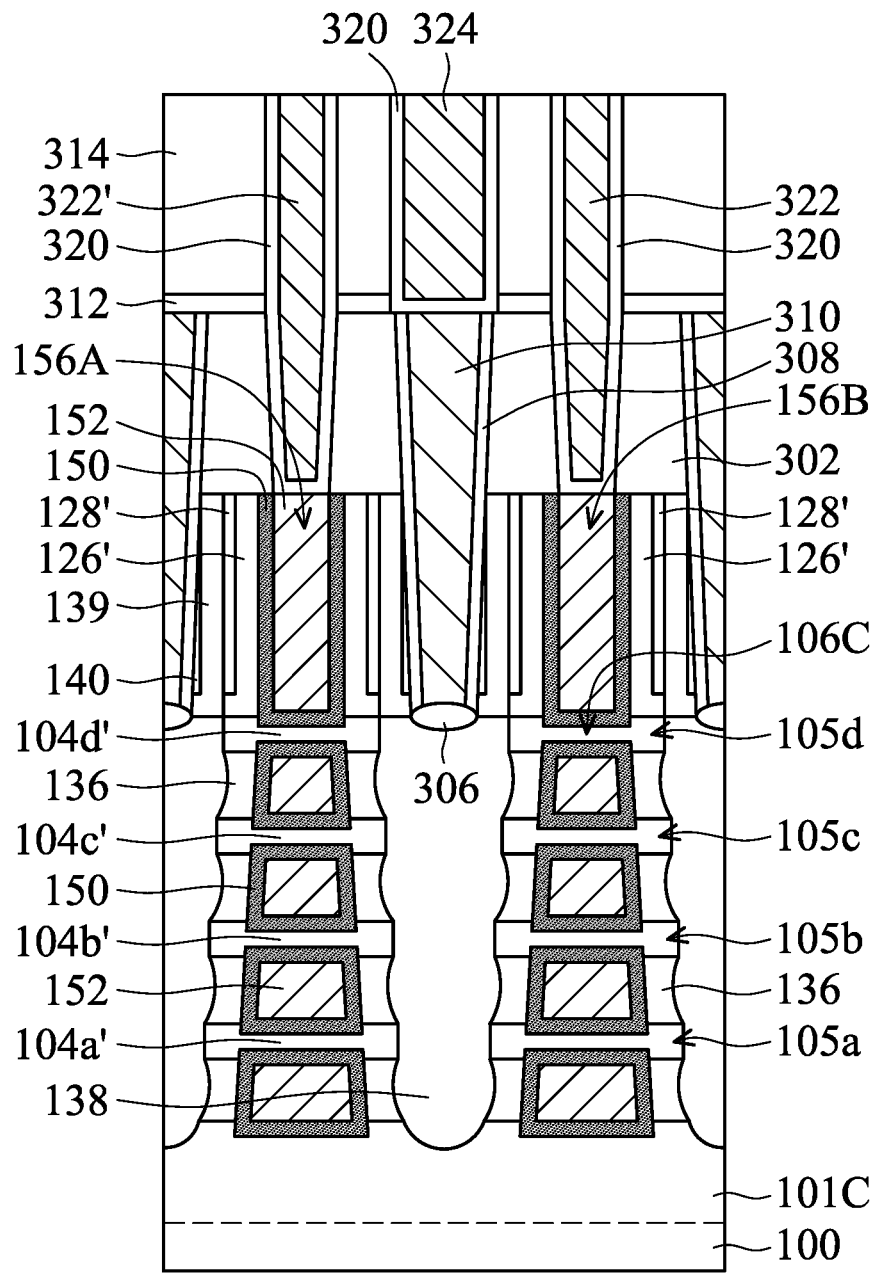
FIG. 5 is a cross-sectional view of an intermediate stage of a process for forming a portion of a semiconductor device structure, in accordance with some embodiments.

Many variations and/or modifications can be made to embodiments of the disclosure. FIG. 5 is a cross-sectional view of a portion of a semiconductor device structure, in accordance with some embodiments.

In some embodiments, a conductive via 322' is formed penetrating through the dielectric layers 314 and 302, as shown in FIG. 5. The conductive via 322' is in electrical contact with the metal gate stack 156A. Due to the profile of the conductive vias 322' and 322, each of the conductive vias 322' and 322 is prevented from being in contact with the conductive contact 310 and the conductive via 324. The short circuiting issue is significantly prevented. Therefore, in some embodiments, the conductive via 322 and the conductive via 322' can be observed in the same cross-sectional view, as shown in FIG. 5. More conductive vias are allowed to be integrated in the limited space of the semiconductor device structure.

Many variations and/or modifications can be made to embodiments of the disclosure. In some embodiments, there are four channel structures (such as the semiconductor nanostructures 104a'-104d') formed. However, embodiments of the disclosure are not limited thereto. Many variations and/or modifications can be made to embodiments of the disclosure. In some embodiments, the total number of semiconductor nanostructures is greater than four. In some other embodiments, the total number of semiconductor nanostructures is smaller than four. The total number of semiconductor nanostructures (or channel structures) of each semiconductor device structure may be fine-tuned to meet requirements. For example, the total number of semiconductor nanostructures may be 3 to 8. The semiconductor nanostructures may have many applicable profiles. The semiconductor nanostructures may include nanosheets, nanowires, or other suitable nanostructures.

Embodiments of the disclosure form a semiconductor device structure with a conductive contact electrically connected to an epitaxial structure and a conductive via electrically connected to a gate stack. The topmost surface of the conductive via is positioned at a higher level than the topmost surface of the conductive contact. The lower portion of the conductive via is allowed to be separated from the conductive contact by a longer distance. As a result, the short circuiting between the conductive contact and the conductive via is significantly prevented. The performance and reliability of the semiconductor device structure are thus improved.

In accordance with some embodiments, a semiconductor device structure is provided. The semiconductor device structure includes a gate stack over a substrate and a source/drain structure over the substrate. The semiconductor device structure also includes a first dielectric layer surrounding the gate stack and covering the source/drain structure and a second dielectric layer over the first dielectric layer and the gate stack. The semiconductor device structure further includes a conductive contact penetrating through the second dielectric layer and the first dielectric layer and electrically connected to the source/drain structure. In addition, the semiconductor device structure includes a third dielectric layer over the second dielectric layer and the conductive contact. The semiconductor device structure includes a first conductive via penetrating through the third dielectric layer and the second dielectric layer and electrically connected to the gate stack. The semiconductor device structure also includes a second conductive via penetrating through the third dielectric layer and electrically connected to the conductive contact.

In accordance with some embodiments, a semiconductor device structure is provided. The semiconductor device structure includes a metal gate stack over a substrate and an epitaxial structure over the substrate. The semiconductor device structure also includes a conductive contact electrically connected to the epitaxial structure. A topmost surface of the metal gate stack is vertically disposed between a topmost surface of the conductive contact and a bottommost surface of the conductive contact. The semiconductor device structure further includes a first conductive via electrically connected to the metal gate stack. The topmost surface of the conductive contact is vertically disposed between a topmost surface of the first conductive via and a bottommost surface of the first conductive via. In addition, the semiconductor device structure includes a second conductive via electrically connected to the conductive contact.

In accordance with some embodiments, a method for forming a semiconductor device structure is provided. The method includes forming a dummy gate stack over a substrate and forming a source/drain structure over the substrate. The method also includes forming a first dielectric layer to surround the dummy gate stack and to cover the source/drain structure. The method further includes replacing the dummy gate stack with a metal gate stack and forming a second dielectric layer over the first dielectric later and the metal gate stack. In addition, the method includes partially removing the first dielectric layer and the second dielectric layer to form a contact opening exposing the source/drain structure and forming a conductive contact in the contact opening. The method includes forming a third dielectric layer over the second dielectric layer and the conductive contact. The method also includes partially removing the third dielectric layer and the second dielectric layer to form a via opening exposing the metal gate stack and forming a conductive via in the via opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a gate stack over a substrate;
    a source/drain structure over the substrate;
    a first dielectric layer surrounding the gate stack and covering the source/drain structure;
    a second dielectric layer over the first dielectric layer and the gate stack;
    a conductive contact penetrating through the second dielectric layer and the first dielectric layer and electrically connected to the source/drain structure;
    a barrier layer laterally surrounding the conductive contact;
    a third dielectric layer over the second dielectric layer and the conductive contact;
    a first conductive via penetrating through the third dielectric layer and the second dielectric layer and electrically connected to the gate stack, wherein the first conductive via has a lower portion laterally surrounded by the second dielectric layer, a top of the lower portion is wider than a bottom of the lower portion, the first conductive via has an upper portion extending from a top surface of the third dielectric layer to a bottom surface of the third dielectric layer, and a top of the upper portion is as wide as a bottom of the upper portion;
    a first glue element laterally surrounding the lower portion the first conductive via and the upper portion of the first conductive via;
    a second conductive via penetrating through the third dielectric layer and electrically connected to the conductive contact; and
    a second glue element having a first portion and a second portion, wherein the first portion extends along a bottom of the second conductive via, the second portion extends along sidewalls of the second conductive via, the first portion of the second glue element extends across outermost edges of the barrier layer, and the first glue element extends across an interface between the barrier layer and the second glue element.

2. The semiconductor device structure as claimed in claim 1, further comprising a spacer element extending along a sidewall of the gate stack, wherein topmost surfaces of the spacer element and a metal gate electrode of the gate stack are substantially level with each other.

3. The semiconductor device structure as claimed in claim 1, wherein the second dielectric layer is in direct contact with a metal gate electrode of the gate stack.

4. The semiconductor device structure as claimed in claim 1, wherein topmost surfaces of the conductive contact and the second dielectric layer are substantially level with each other.

5. The semiconductor device structure as claimed in claim 1, wherein topmost surfaces of the first conductive via and the second conductive via are substantially level with each other.

6. The semiconductor device structure as claimed in claim 1, wherein the first conductive via has an upper sidewall and a lower sidewall, the upper sidewall is laterally surrounded by the third dielectric layer and extends from the top surface of the third dielectric layer to the bottom surface of the third dielectric layer, the lower sidewall is laterally surrounded by the second dielectric layer, and the lower sidewall is steeper than the upper sidewall.

7. The semiconductor device structure as claimed in claim 6, wherein an entirety of the upper sidewall of the first conductive via is a substantially vertical sidewall.

8. The semiconductor device structure as claimed in claim 1, wherein an entirety of the conductive contact is integrally formed.

9. The semiconductor device structure as claimed in claim 1, wherein an entirety of the first conductive via is integrally formed.

10. The semiconductor device structure as claimed in claim 1, wherein a topmost surface of the first dielectric layer is closer to the substrate than a bottommost surface of the first conductive via.

11. The semiconductor device structure as claimed in claim 1, further comprising:
an etch stop layer between the second dielectric layer and the third dielectric layer, wherein the etch stop layer is in direct contact with the first glue element and the second glue element.

12. The semiconductor device structure as claimed in claim 1, wherein the first glue element and the second glue element are made of a same material.

13. A semiconductor device structure, comprising:
a metal gate stack over a substrate;
an epitaxial structure over the substrate;
a conductive contact electrically connected to the epitaxial structure, wherein a topmost surface of the metal gate stack is vertically disposed between a topmost surface of the conductive contact and a bottommost surface of the conductive contact;
a barrier layer extending along sidewalls of the conductive contact;
a first conductive via electrically connected to the metal gate stack, wherein the topmost surface of the conductive contact is vertically disposed between a topmost surface of the first conductive via and a bottommost surface of the first conductive via, and the first conductive via has a lower portion extending across a top of the conductive contact, and the lower portion has an inclined sidewall;
a first glue element extending along the inclined sidewall of the lower portion of the first conductive via and a sidewall of an upper portion of the first conductive via;
a second conductive via electrically connected to the conductive contact;
a second glue element having a first portion and a second portion, wherein the first portion extends along a bottom of the second conductive via, the second portion extends along sidewalls of the second conductive via, the first portion of the second glue element extends across edges of the barrier layer, and an interface between the barrier layer and the second glue element is vertically between a top of the first glue element and a bottom of the first glue element;
a second metal gate stack over the substrate, wherein a portion of the conductive contact is between the metal gate stack and the second metal gate stack, and the epitaxial structure is laterally between the metal gate stack and the second metal gate stack; and
a third conductive via electrically connected to the second metal gate stack, wherein the topmost surface of the conductive contact is vertically disposed between a topmost surface of the third conductive via and a bottommost surface of the third conductive via, the first conductive via, the second conductive via, the third conductive via, and the epitaxial structure can be observed in a same cross-sectional view.

14. The semiconductor device structure as claimed in claim 13, wherein an entirety of the conductive contact is integrally formed.

15. The semiconductor device structure as claimed in claim 13, wherein an entirety of the first conductive via is integrally formed.

16. The semiconductor device structure as claimed in claim 13, further comprising a dielectric layer laterally surrounding the lower portion of the first conductive via, wherein a topmost surface of the dielectric layer is substantially level with the topmost surface of the conductive contact.

17. A method for forming a semiconductor device structure, comprising:
forming a dummy gate stack over a substrate;
forming a source/drain structure over the substrate;
forming a first dielectric layer to surround the dummy gate stack and to cover the source/drain structure;
replacing the dummy gate stack with a metal gate stack, wherein the metal gate stack has a gate dielectric layer and a metal gate electrode;
forming a second dielectric layer over the first dielectric layer and the metal gate stack;
partially removing the first dielectric layer and the second dielectric layer to form a contact opening exposing the source/drain structure;
forming a barrier layer in the contact opening;
forming a conductive contact in the contact opening, wherein the barrier layer extends along sidewalls of the conductive contact;
forming a third dielectric layer over the second dielectric layer and the conductive contact;
partially removing the third dielectric layer and the second dielectric layer to form a via opening exposing the metal gate stack, wherein the via opening has an upper portion laterally surrounded by the third dielectric layer and a lower portion laterally surrounded by the second dielectric layer, a top of the upper portion is as wide as a bottom of the upper portion, and the lower portion has an inclined sidewall;
forming a first glue element in the via opening;
forming a conductive via in the via opening, wherein the first glue element extends along sidewalls of the conductive via;
partially removing the third dielectric layer to form a second via opening exposing the conductive contact;
forming a second glue element in the second via opening; and
forming a second conductive via in the second via opening, wherein the second glue element has a first portion extending along a bottom of the second conductive via, the second glue element has a second portion extending along sidewalls of the second conductive via, the first portion of the second glue element extends across edges of the barrier layer, and the first glue element extends upwards to surpass an interface between the barrier layer and the second glue element.

18. The method for forming a semiconductor device structure as claimed in claim 17, wherein the via opening is formed before the second via opening.

19. The method for forming a semiconductor device structure as claimed in claim 17, wherein the second conductive via is formed before the conductive via.

20. The semiconductor device structure as claimed in claim 17, wherein the first glue element and the second glue element are simultaneously formed.

* * * * *